US012593734B2

(12) United States Patent
An et al.

(10) Patent No.: US 12,593,734 B2
(45) Date of Patent: Mar. 31, 2026

(54) SUBSTRATE ASSEMBLY OF DISPLAY DEVICE USING LIGHT-EMITTING DIODE AND METHOD FOR MANUFACTURING SAME

(71) Applicant: LG ELECTRONICS INC., Seoul (KR)

(72) Inventors: Jaeyong An, Seoul (KR); Joodo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 365 days.

(21) Appl. No.: 18/270,786

(22) PCT Filed: Jan. 4, 2021

(86) PCT No.: PCT/KR2021/000026
§ 371 (c)(1),
(2) Date: Jul. 3, 2023

(87) PCT Pub. No.: WO2022/145555
PCT Pub. Date: Jul. 7, 2022

(65) Prior Publication Data
US 2024/0297156 A1      Sep. 5, 2024

(51) Int. Cl.
*H01L 25/075* (2006.01)
*H01L 25/16* (2023.01)

(52) U.S. Cl.
CPC ........ *H01L 25/0753* (2013.01); *H01L 25/167* (2013.01)

(58) Field of Classification Search
None
See application file for complete search history.

(56) References Cited

U.S. PATENT DOCUMENTS

| | | | | |
|---|---|---|---|---|
| 10,607,515 | B2 * | 3/2020 | Park | H01L 24/82 |
| 2017/0179096 | A1 * | 6/2017 | Dang | H01L 21/6836 |
| 2022/0352445 | A1 * | 11/2022 | Kim | H10H 20/857 |

FOREIGN PATENT DOCUMENTS

| | | |
|---|---|---|
| JP | 2005-174979 A | 6/2005 |
| KR | 10-0437533 B1 | 6/2004 |

(Continued)

*Primary Examiner* — Bo B Jang
(74) *Attorney, Agent, or Firm* — Birch, Stewart, Kolasch & Birch, LLP

(57) ABSTRACT

The present invention is applicable to a display device-related technical field and relates to, for example, a substrate assembly of a display device using a micro light-emitting diode (LED) and to a method for manufacturing same. The present invention relates to a method for assembling individual light-emitting diodes on a plurality of individual device regions of a first substrate assembly in which the plurality of individual device regions are partitioned on a first substrate and first electrodes are positioned in the individual device regions, wherein the method may comprise the steps of: positioning a second substrate assembly including an insulation layer positioned on the first substrate assembly, second electrodes positioned on the insulation layer, and a second substrate positioned on the second electrodes; injecting a fluid in which a plurality of light-emitting diodes are dispersed between the first substrate assembly and the second substrate assembly; and flowing the plurality of light-emitting diodes; and assembling at least one of the plurality of light-emitting diodes on the first electrodes positioned in the individual device regions.

20 Claims, 26 Drawing Sheets

(56)     References Cited

FOREIGN PATENT DOCUMENTS

| KR | 10-2020-0005516 A | 1/2020 |
| KR | 10-2020-0014867 A | 2/2020 |
| KR | 10-2020-0059367 A | 5/2020 |

* cited by examiner

FIG. 3a

FIG. 3b f = 1 kHz (a) Positive DEP (b) Negative DEP

SUBSTRATE ASSEMBLY OF DISPLAY DEVICE USING LIGHT-EMITTING DIODE AND METHOD FOR MANUFACTURING SAME

CROSS REFERENCE TO RELATED APPLICATIONS

This application is the National Phase of PCT/KR2021/000026 filed on Jan. 4, 2021, which is hereby expressly incorporated by reference into the present application.

TECHNICAL FIELD

The present disclosure is applicable to a display device-related technical field, and relates to, for example, a substrate assembly of a display device using a micro light emitting diode (LED) and a method for manufacturing the same.

BACKGROUND

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed.

Recently, such light emitting diode (LED) has been gradually miniaturized and manufactured into a micro-sized LED to be used as a pixel of the display device.

Such micro LED technology exhibits characteristics of low power, high brightness, and high reliability compared to other display devices/panels, and is able to be applied to a flexible device as well. Therefore, in recent years, research institutes and companies have been actively researching the micro LED.

A recent issue in relation to the micro LED is a technology to transfer the LED to a panel. Many LEDs are used to manufacture one display device using the micro LEDs, but it is very difficult and time-consuming to manufacture the display device by attaching the LEDs to the panel one by one.

In addition, a technical difficulty increases as resolution and area size of the display device increase.

Therefore, a solution to the problems that occur when manufacturing the display using such a micro LED is on the rise.

SUMMARY

Technical Problem

The present disclosure is to provide a substrate assembly of a display device using a light emitting device and a method for manufacturing the same that are applicable to a high-resolution large-area display.

In addition, the present disclosure is to provide a substrate assembly of a display device using a light emitting device and a method for manufacturing the same that may solve problems of existing micro LED manufacturing methods, for example, reliability, precision, and complexity.

In addition, the present disclosure is to provide a substrate assembly of a display device using a light emitting device and a method for manufacturing the same that may improve an assembly yield even when using a small number of light emitting devices are used.

In addition, the present disclosure is to provide a substrate assembly of a display device using a light emitting device and a method for manufacturing the same that are advantageous in assembling a large-area display device.

The present disclosure is to provide a substrate assembly of a display device using a light emitting device and a method for manufacturing the same that may reduce an assembly time of the light emitting devices.

In addition, the present disclosure is to provide a substrate assembly of a display device using a light emitting device and a method for manufacturing the same that, when an assembly of the light emitting devices is defective or the light emitting devices are not assembled, may solve a cost increase resulted from such assembly defect.

Technical Solutions

As a first aspect of the present disclosure for achieving the above purpose, a method for assembling individual light emitting devices respectively onto individual device areas of a first substrate assembly where the multiple individual device areas are divided from each other on a first substrate and each first electrode is located in each individual device area includes positioning a second substrate assembly including an insulating layer located on the first substrate assembly, a second electrode located on the insulating layer, and a second substrate located on the second electrode, injecting fluid where the multiple light emitting devices are dispersed between the first substrate assembly and the second substrate assembly, allowing the multiple light emitting devices to flow, and assembling at least one of the multiple light emitting devices onto the first electrode located within the individual device area.

The allowing of the multiple light emitting devices to flow may include applying a voltage signal in a first frequency range.

The first frequency range may correspond to a frequency generating an electro-wetting phenomenon.

The assembling of at least one of the multiple light emitting devices may include applying a voltage signal in a second frequency range greater than a first frequency range.

The second frequency range may correspond to a frequency generating a dielectrophoresis phenomenon.

The method may further include allowing the fluid where the multiple light emitting devices are dispersed to migrate to a neighboring individual device area.

The method may further include, after the assembling of at least one of the multiple light emitting devices, collecting the fluid where the multiple light emitting devices are dispersed.

The fluid may be a conductive liquid.

The fluid where the multiple light emitting devices may be dispersed is locally injected to be in contact with the one first electrode.

The first electrode may serve as an assembly electrode configured to assemble at least one of the multiple light emitting devices and as a driving electrode configured to drive the assembled light emitting device.

As a second aspect of the present disclosure for achieving the above purpose, a method for assembling individual light emitting devices respectively onto individual device areas of a first substrate assembly including a partition wall defining the individual device areas on a first substrate, a first hydrophobic film located on the partition wall, and each first electrode located on each individual device area includes positioning, on the first hydrophobic film, a second substrate assembly including a second hydrophobic film located on and spaced, by a predetermined spacing, apart from the first hydrophobic film, a second electrode located on the insulating layer, and a second substrate located on the second electrode, injecting fluid where the multiple light emitting devices are dispersed between the first substrate assembly and the second substrate assembly, allowing the multiple light emitting devices to flow by applying a voltage signal in a first frequency range to the first electrode, and assembling at least one of the multiple light emitting devices onto the first electrode by applying a voltage signal in a second frequency range greater than the first frequency range to the first electrode.

The method may further include allowing the fluid to migrate to a second area adjacent to a first area while maintaining the application of the voltage in the second frequency range to the first area where the light emitting device is assembled.

As a third aspect of the present disclosure for achieving the above purpose, a method for assembling individual light emitting devices respectively onto individual device areas of a first substrate assembly where the multiple individual device areas are divided from each other on a first substrate and each first electrode is located in each individual device area includes positioning a second substrate assembly including a second substrate where a second electrode located on and spaced apart from the first substrate assembly is located, injecting fluid where the multiple light emitting devices are dispersed between the first substrate assembly and the second substrate assembly, allowing the multiple light emitting devices to flow by applying a first voltage signal to the first electrode or the second electrode, and assembling at least one of the multiple light emitting devices onto the first electrode located within the individual device area by applying a second voltage signal to the first electrode or the second electrode.

As a fourth aspect of the present disclosure for achieving the above purpose, a substrate assembly of a display device using a light emitting device includes a first substrate assembly including multiple individual device areas, and a second substrate assembly located on and spaced, by a predetermined spacing, apart from the first substrate assembly, the substrate assembly allows multiple light emitting devices to flow or migrate and assembles the light emitting devices respectively onto the multiple individual device areas, the first substrate assembly includes a first substrate, a partition wall disposed on the first substrate to define the multiple individual device areas, a first hydrophobic film located on the partition wall, and each first electrode located on each individual device area, and the second substrate assembly includes a second hydrophobic film located on the first hydrophobic film, an insulating layer located on the second hydrophobic film, a second electrode located on the insulating layer, and a second substrate located on the second electrode.

The second substrate assembly may be temporarily located on the first substrate assembly.

Advantageous Effects

According to one embodiment of the present disclosure, following effects are obtained.

First, the method for manufacturing the display device using the light emitting device according to the embodiment of the present disclosure may be applied to the self-assembly method applicable to the high-resolution large-area display.

Such manufacturing method according to the embodiment of the present disclosure may solve the problems of the existing micro LED manufacturing methods, for example, the reliability, the precision, and the complexity.

In addition, the manufacturing method according to the embodiment of the present disclosure may be applied to all of the red, green, and blue light emitting devices, so that the high-luminance full-color display may be implemented.

In addition, according to the manufacturing method according to the embodiment of the present disclosure, in the case of the vertical light emitting device, the assembly electrode may be used as the driving electrode as it is, reducing the process difficulty and realizing the high-resolution display.

In addition, according to the manufacturing method according to the embodiment of the present disclosure, the own flow or migration of the fluid in which the light emitting devices are dispersed may be generated, so that the assembly yield may be improved even when using a small number of light emitting devices are used.

In addition, the manufacturing method according to the embodiment of the present disclosure is advantageous in assembling the large-area display device because the light emitting devices dispersed in the fluid may be freely migrated to any location by the application of the voltage.

In addition, according to the manufacturing method according to the embodiment of the present disclosure, because the light emitting devices may be assembled while at the same time migrating the fluid using the multiple fluid droplets, so that the assembly time may be further reduced.

In addition, according to the manufacturing method according to the embodiment of the present disclosure, when the assembly of the light emitting devices is defective or the light emitting devices are not assembled, the re-assembly is possible by migrating the fluid to an electrode where such problem has occurred. Therefore, the cost increase resulted from the assembly defect may be solved.

Furthermore, according to another embodiment of the present disclosure, there are additional technical effects not mentioned herein. A person skilled in the art may understand the entire meaning of the present document and drawings.

BRIEF DESCRIPTION OF THE DRAWINGS

FIGS. 3A and 3B are cross-sectional diagrams taken along the cutting lines B-B and C-C in FIG. 2;

FIG. 22 is a schematic cross-sectional view illustrating a process of assembling a red light emitting device in a method for manufacturing a display device using a semiconductor light emitting element according to an embodiment of the present disclosure;

FIG. 23 is a schematic cross-sectional view illustrating a process of assembling a green light emitting device in a method for manufacturing a display device using a semiconductor light emitting element according to an embodiment of the present disclosure;

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
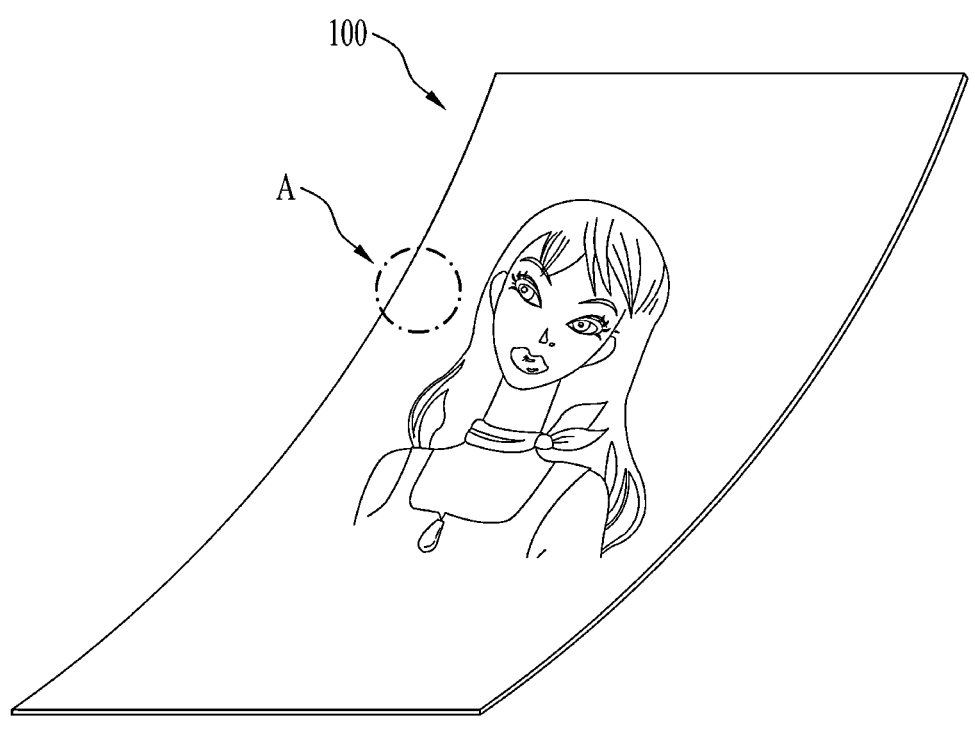
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
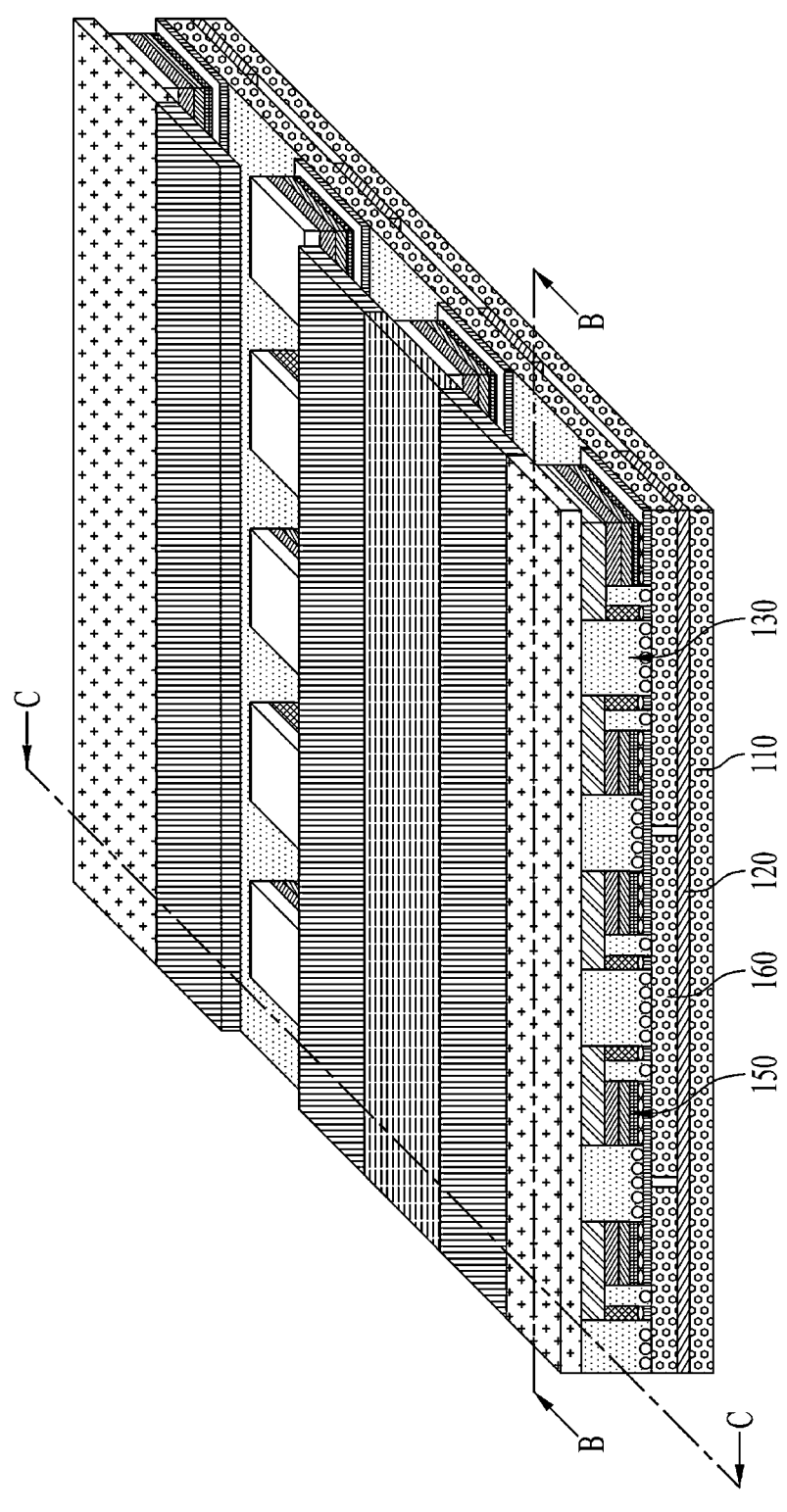
FIG. 2 is a partially enlarged diagram showing a part A shown in FIG. 1.

FIG. 2 is a partially enlarged view showing part A of FIG. 1.

Figures 3A, 3B:
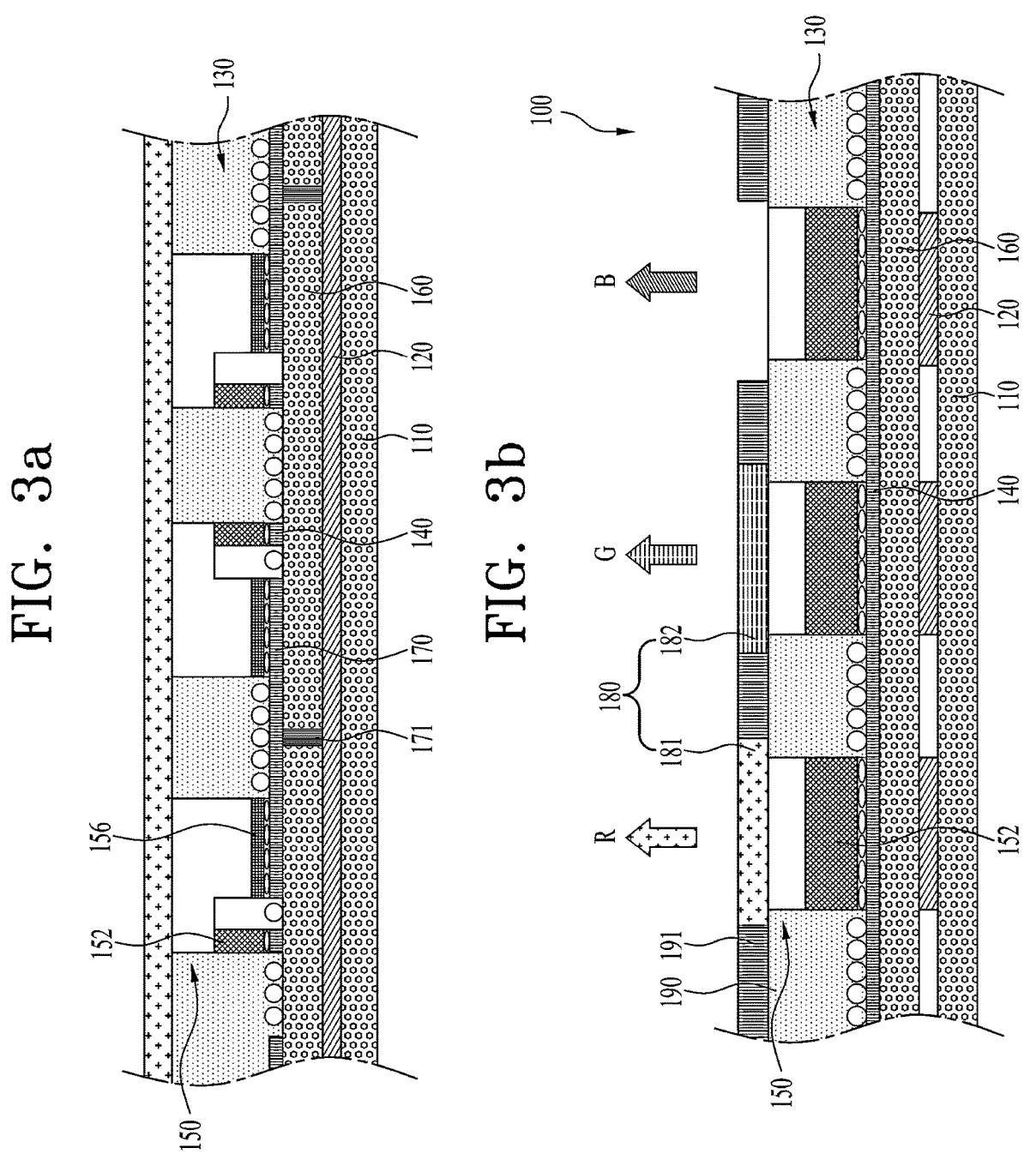

FIGS. 3A and 3B are cross-sectional views taken along lines B-B and C-C in FIG. 2.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Figure 4:
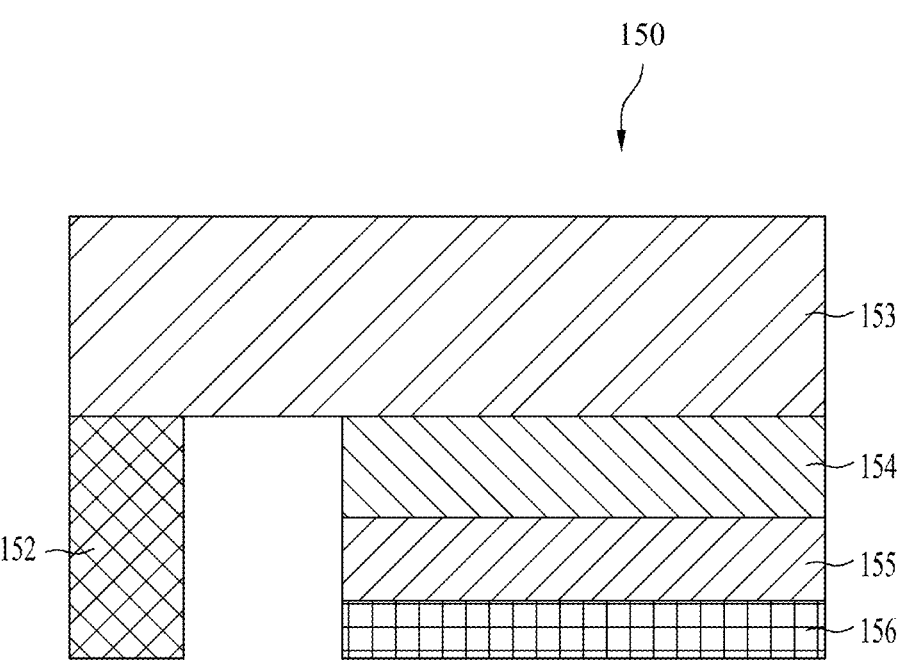
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIGS. 3a and 3b, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Figures 5A, 5B:
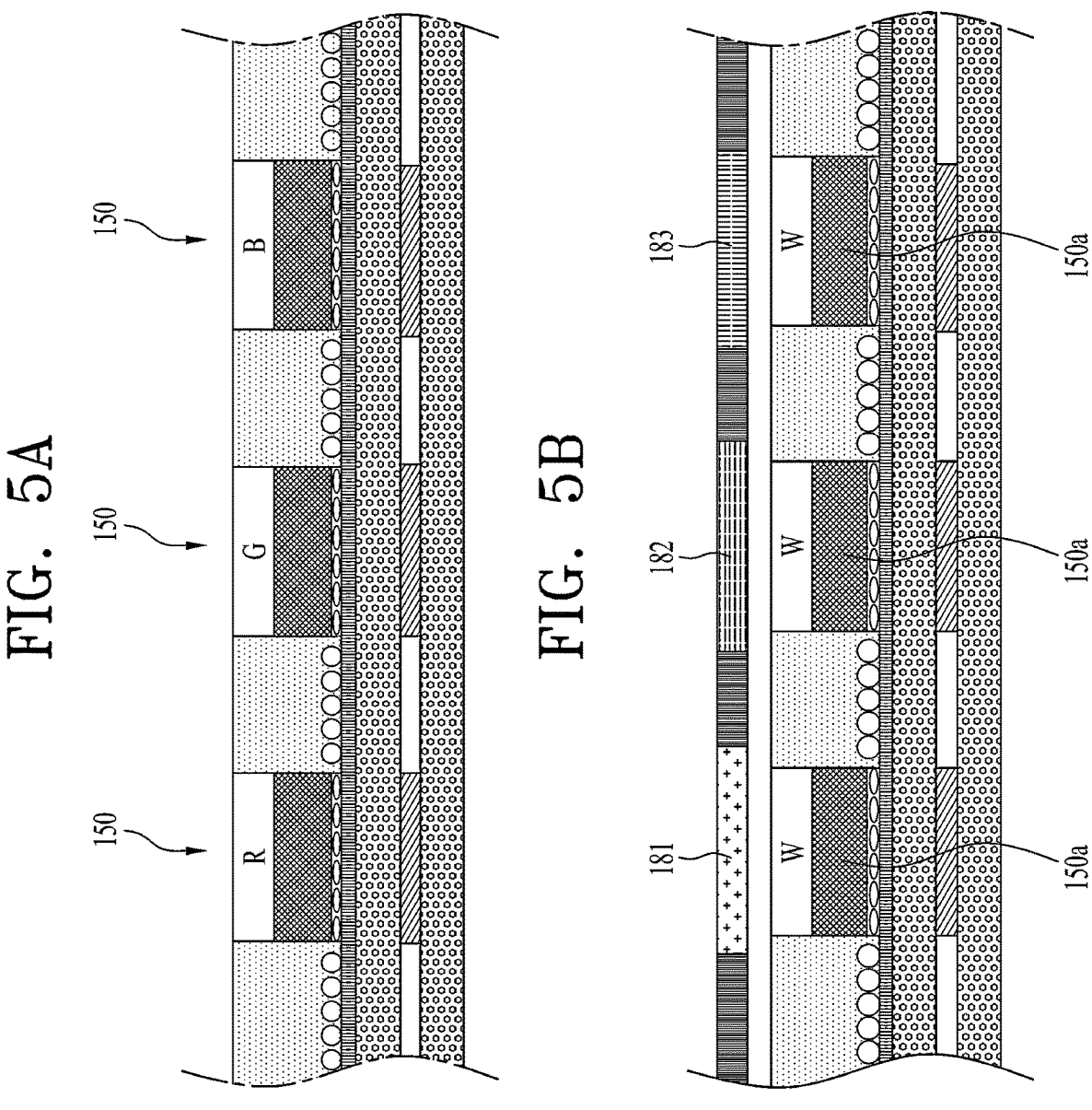
FIGS. 5A to 5C are conceptual diagrams illustrating various examples of color implementation with respect to a flip-chip type semiconductor light emitting element.
Figure 5C:
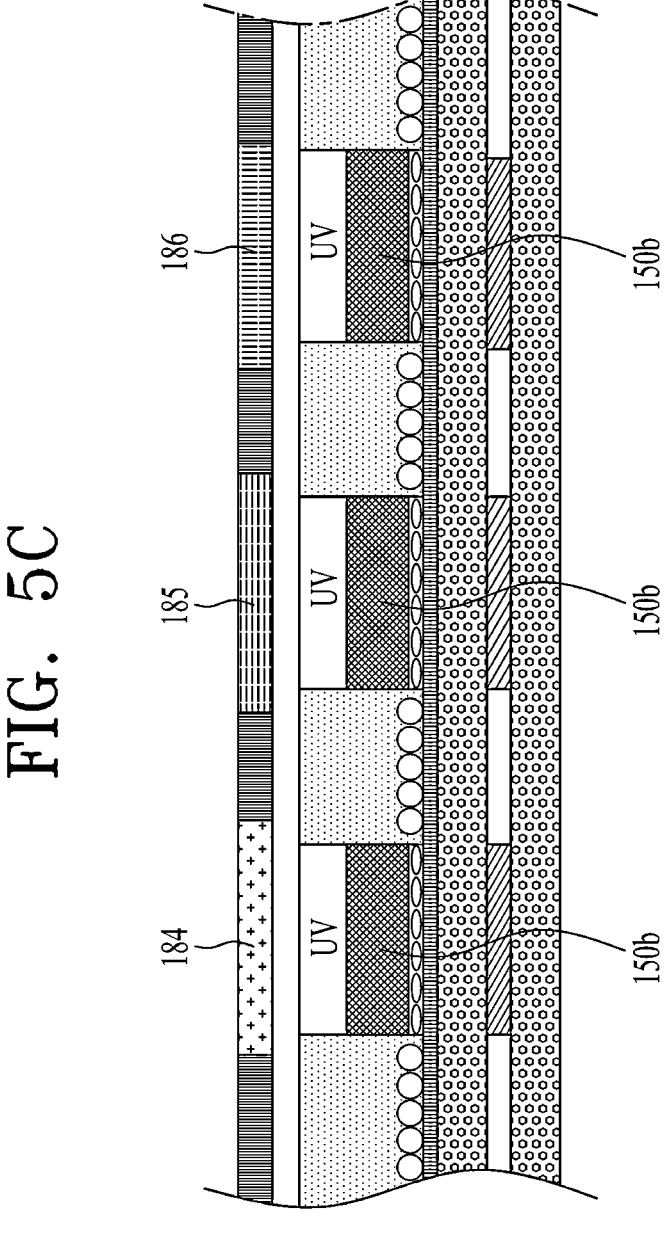

FIGS. 5A to 5C are conceptual views illustrating various examples of implementation of colors in relation to a flip-chip type semiconductor light emitting element.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 184, a green phosphor conversion layer 185, and a blue phosphor conversion layer 186 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
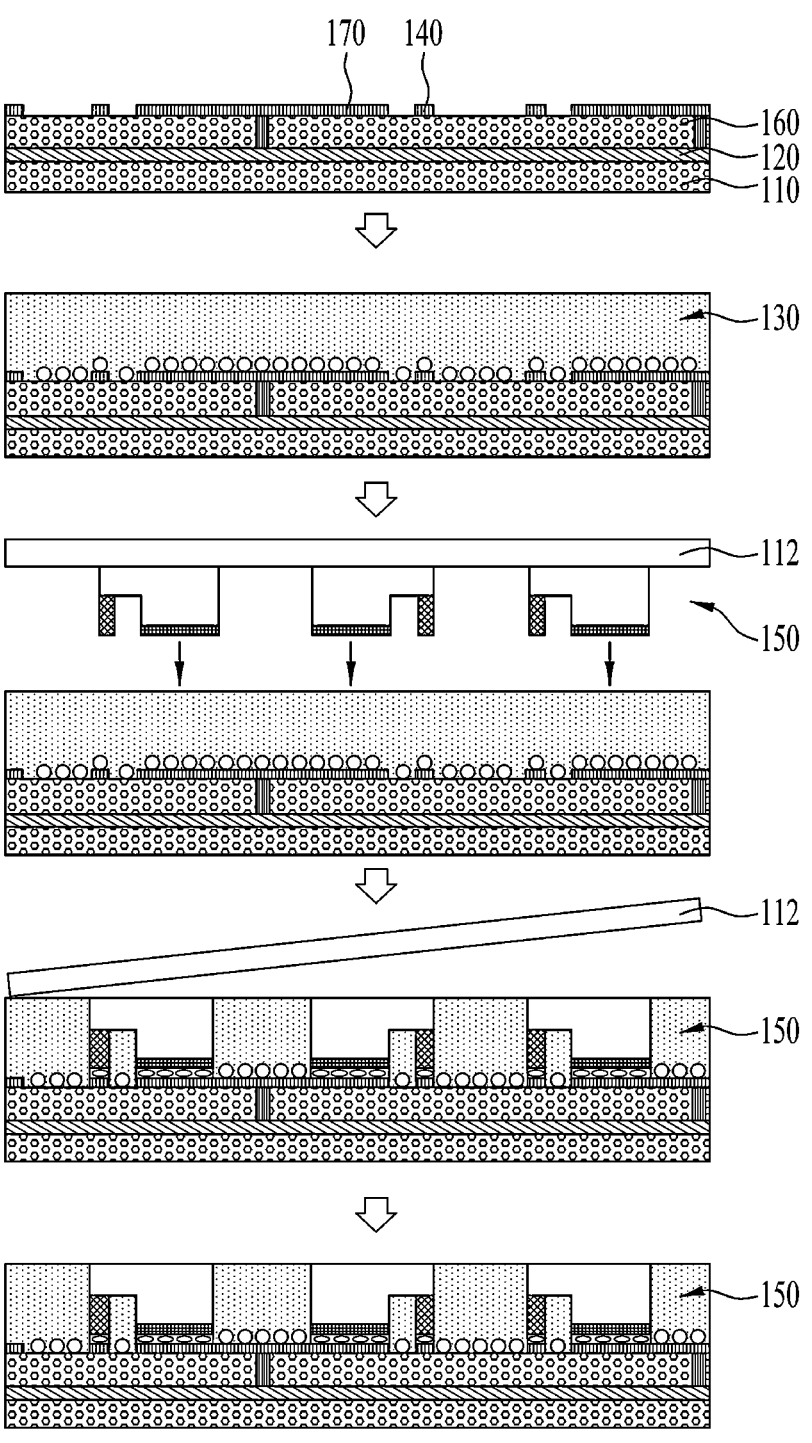
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode

140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
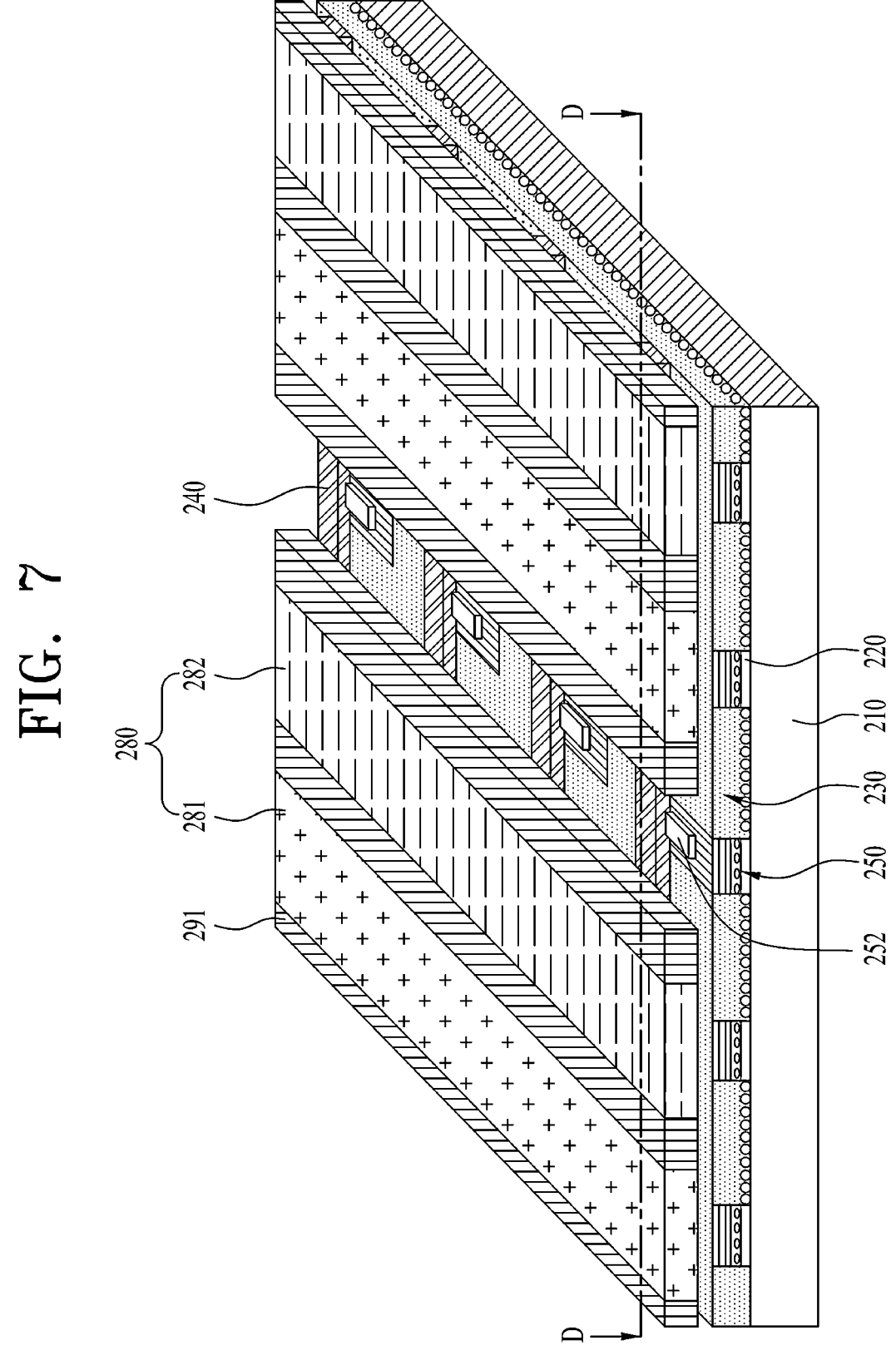
FIG. 7 is a perspective diagram of a display device using a semiconductor light emitting element according to another embodiment of the present disclosure.
Figure 8:
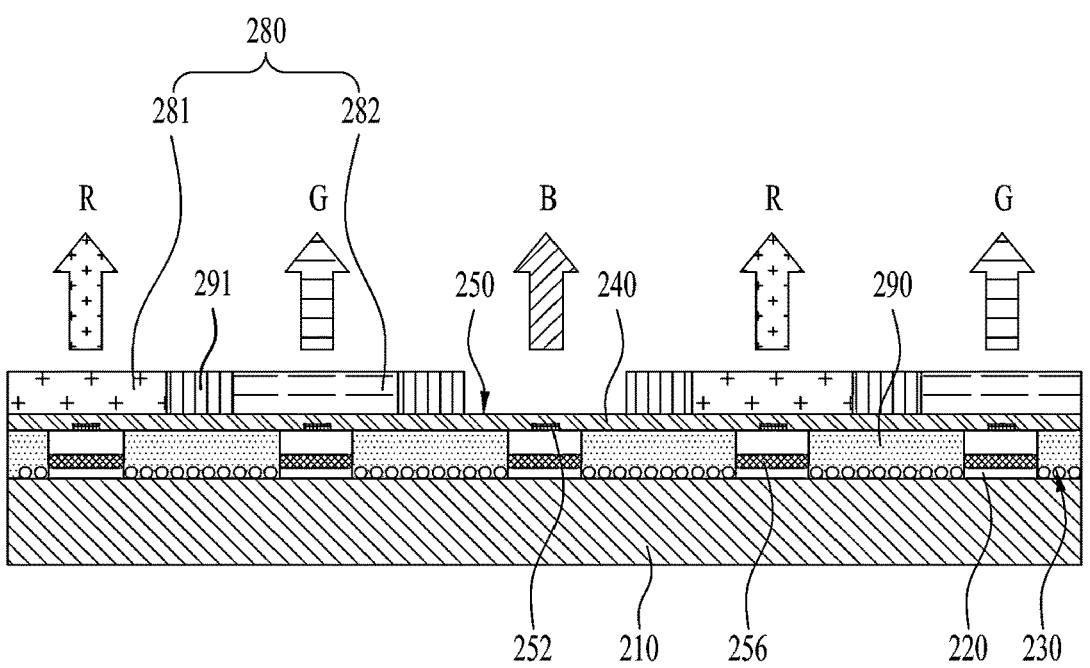
FIG. 8 is a cross-sectional diagram taken along a cutting line D-D shown in FIG. 7.
Figure 9:
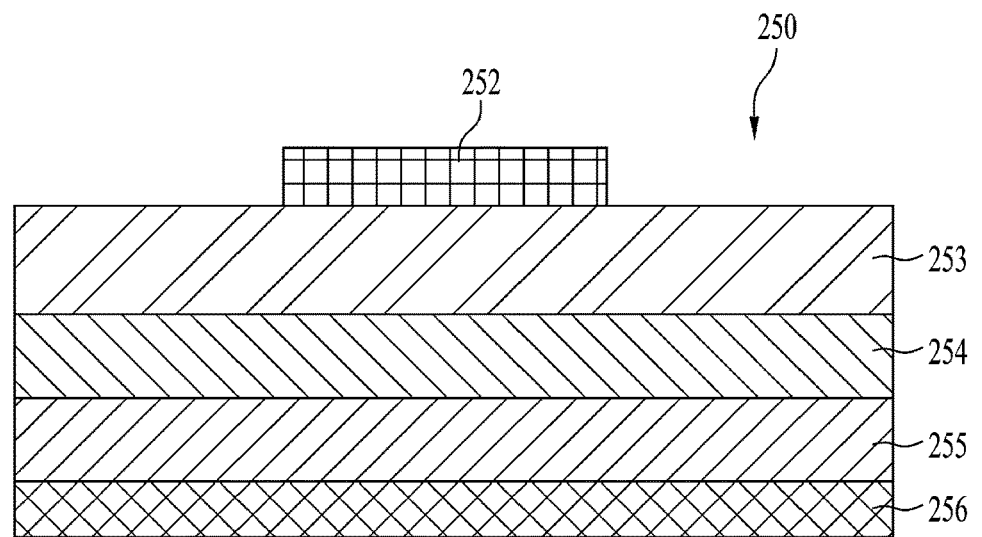
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 220 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240) described later. Since such a vertical type semiconductor light emitting element 250) can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250) configuring the individual pixel is sufficiently long, the second electrode 240 may be located between the semiconductor light emitting elements 250).

The second electrode 240) may be formed as an electrode of a bar type that is long in one direction and disposed in a direction vertical to the first electrode.

In addition, the second electrode 240) and the semiconductor light emitting element 250) may be electrically connected to each other by a connecting electrode protruding from the second electrode 240). Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240) and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240) is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

In the display device using the semiconductor light emitting element according to the present disclosure described above, the semiconductor light emitting element is disposed on the wiring substrate in the flip-chip type and used as an individual pixel.

Figure 10:
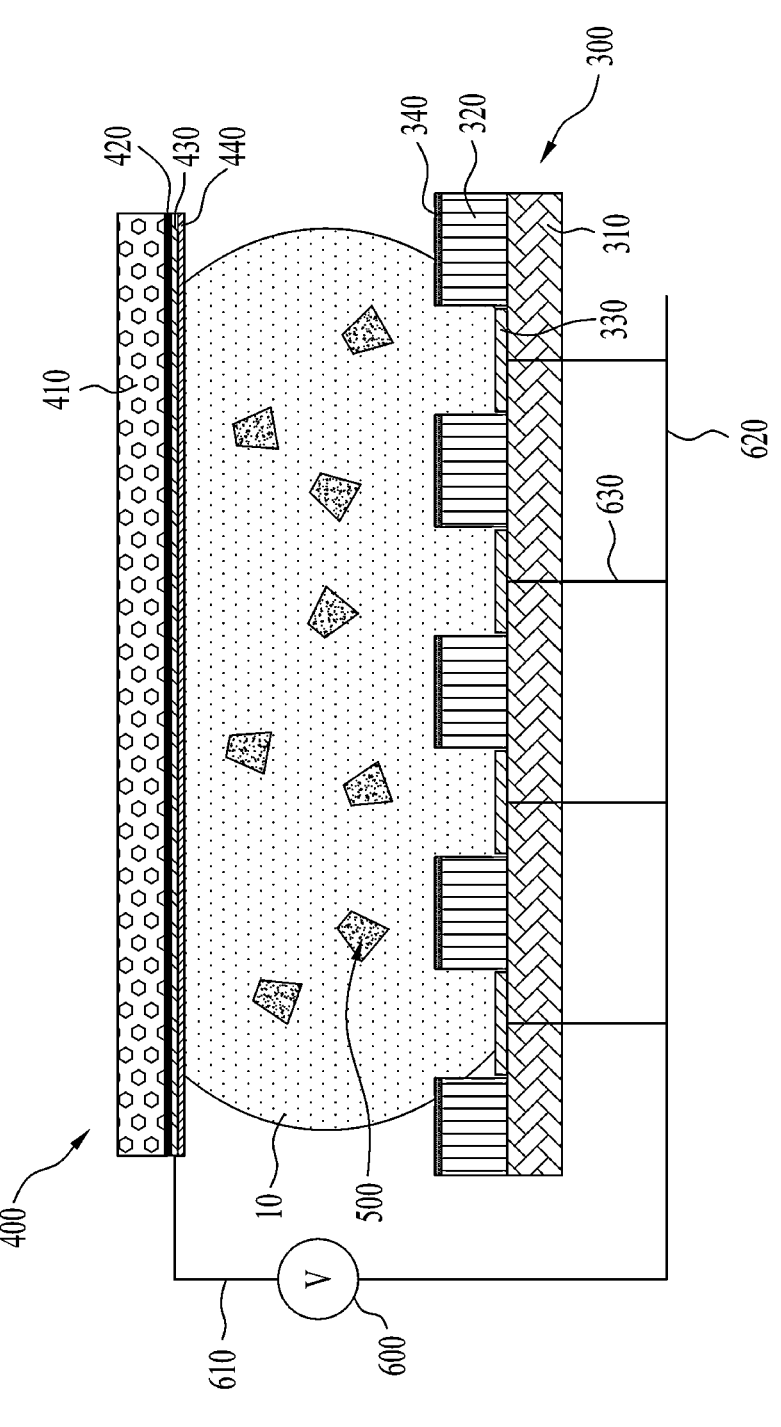
FIG. 10 is a conceptual diagram illustrating a method for manufacturing a display device using a semiconductor light emitting element according to an embodiment of the present disclosure.

FIG. 10 is a conceptual diagram illustrating a method for manufacturing a display device using a semiconductor light emitting element according to an embodiment of the present disclosure.

Referring to FIG. 10, the method for manufacturing the display device using the semiconductor light emitting element according to the embodiment of the present disclosure may be implemented with a first substrate assembly 300 and a second substrate assembly 400 located on and spaced, by a predetermined distance, apart from the first substrate assembly 300.

The first substrate assembly 300 may include multiple individual device areas divided from each other, and each first electrode 330 disposed on a first substrate 310 may be disposed in each individual device area.

In this regard, the multiple individual device areas may be divided from each other by a partition wall 320. In this regard, the partition wall 320 may form a physical structure that may define the multiple individual device areas in the divided manner. The multiple individual device areas defined by such a partition wall 320 may define spaces in which respective light emitting devices 500 are mounted.

Such a partition wall 320 may be made of an insulator, but the present disclosure may not be limited thereto. In addition, the multiple individual device areas may be defined even when there is no partition wall 320. For example, the multiple individual device areas may be defined by only the first electrodes 330.

As such, each first electrode 330 may be located in each of the multiple individual device areas. Such individual device area may form a sub-pixel of the display device. Accordingly, the individual device area may be referred to as an individual sub-pixel area or an individual unit pixel area. Such individual unit pixel and area thereof may be the same as those described with reference to FIGS. 1 to 9. In addition, because such individual device area corresponds to an area where the light emitting device 500 constituting the unit pixel is assembled, it may also be referred to as a seating portion of an assembly substrate.

Each first electrode 330 may be located in each of such individual device areas. In some cases, the first electrode 330 may not be located in at least one of such individual device areas. For example, the first electrode 330 may not be located in an individual device area located at the most end side.

The first substrate 310 may include an active matrix (AM) display structure. For example, the first substrate 310 may include a thin film transistor (TFT) or a CMOS. Such a TFT or CMOS may be connected to the first electrode 330. Accordingly, when the display is driven in an active matrix scheme, power switched and scaled by the TFT or the CMOS may be applied to the first electrode 330. Here, a detailed structure of the first substrate 310 is omitted.

As another example, the first substrate 310 may include a passive matrix (PM) structure. For example, the first substrate 310 may include a structure for passive matrix driving.

A first hydrophobic film 340 may be positioned on the partition wall 320. That is, the first hydrophobic film 340 may be coated and formed on the partition wall 320.

The second substrate assembly 400 may include a second substrate 410 having a second electrode 420 located on and spaced apart from the first substrate assembly 300. In this regard, an insulating layer 430 may be positioned on the second electrode 420. For example, the second electrode 420 may be covered with the insulating layer 430.

A second hydrophobic film 440 may be positioned on such an insulating layer 430. That is, the second hydrophobic film 440 may be coated and formed on the insulating layer 430.

At least one of the first hydrophobic film 340 and the second hydrophobic film 440 may be made of a material such as Teflon, PTFE, or Cytop.

The second substrate 410 may include a transparent substrate. In one example, the second substrate 410 may be formed as the transparent substrate. Such a transparent substrate may include a resin substrate or a glass substrate.

In addition, the second electrode 420 may include a transparent electrode. For example, the second electrode 420 may be formed as the transparent electrode. Such a second electrode 420 may be made of a material such as conductive oxide (e.g., ITO). In some cases, the second electrode 420 may be divided into a size of the individual device area. That is, the second electrode 420 may be pixelated.

Each of the first electrode 330 and the second electrode 420 may be connected to a power supply 600. The second electrode 420 may be connected to the power supply 600 by a first power line 610. The first electrode 330 may be connected to the power supply 600 by a second power line 620 connected to the power supply 600, and a second branch line 630 branched from such a second power line 620 and connected to each first electrode 330.

Fluid 10 in which the multiple light emitting devices 500 are dispersed may be injected between the first substrate assembly 300 and the second substrate assembly 400. Such fluid 10 may be a conductive or polar liquid. In one example, the fluid 10 may be an electrolyte liquid. As an example, the fluid 10 may be Di-ionization water (DI water), ionic liquid, or other water-based mixed materials (salt and surfactant).

In this regard, the injection of the fluid 10 may be performed via a dispenser, an inkjet method, or the like.

In FIG. 10, a state in which one droplet of the fluid 10 is used is shown, but multiple droplets of the fluid 10 may also be used at the same time.

As such, the fluid 10 in which the multiple light emitting devices 500 are dispersed may flow or migrate by an electro-wetting phenomenon. To this end, a voltage signal (a first voltage signal) having a predetermined frequency range (a first frequency range) may be applied to at least one of the first electrode 330 and the second electrode 420, or to the first electrode 330 or the second electrode 420. In this regard, such predetermined frequency range may be a frequency range in which the electro-wetting phenomenon may occur.

Thereafter, the multiple light emitting devices 500 dispersed and flowed within the fluid 10 may be assembled in the respective individual device areas. For example, the multiple light emitting devices 500 that are dispersed and flowed may be assembled in the respective individual device areas by a dielectrophoresis phenomenon. To this end, a voltage signal (a second voltage signal) having a predetermined frequency range (a second frequency range) different from the first frequency range may be applied to at least one of the first electrode 330 and the second electrode 420, or to the first electrode 330 or the second electrode 420. Such predetermined frequency range may be a frequency range in which the dielectrophoresis phenomenon may occur. In this regard, the second frequency range may be greater than the first frequency range.

A process of assembling the multiple light emitting devices 500 using the electro-wetting phenomenon and the dielectrophoretic phenomenon will be described later in detail.

Figure 11:
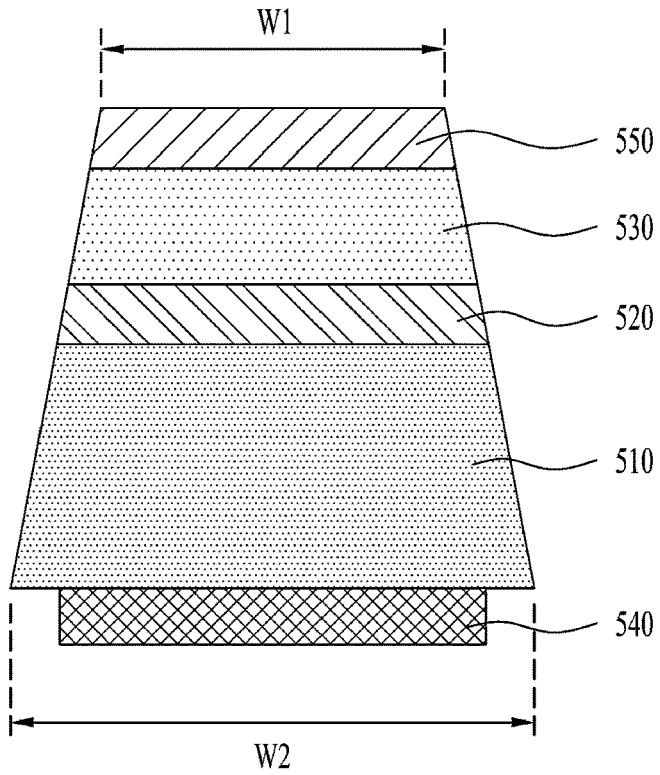
FIG. 11 is a cross-sectional view showing an example of a light emitting device that may be used in a display device using a semiconductor light emitting element according to an embodiment of the present disclosure.

FIG. 11 is a cross-sectional view showing an example of a light emitting device that may be used in a display device using a semiconductor light emitting element according to an embodiment of the present disclosure.

Referring to FIG. 11, the light emitting device 500 may be the semiconductor light emitting element. That is, the light emitting device 500 may be the light emitting diode (LED).

The light emitting device 500 used in the embodiment of the present disclosure may have different widths of lower and upper sides for vertical selectivity. For example, as shown in FIG. 11, a width of the lower side (a second width) W2 may be greater than a width of the upper side (a first width) W1. Therefore, when the light emitting device 500 migrates or flows within the fluid 10 by the electro-wetting phenomenon and is positioned in the individual device area, the lower side of the light emitting device 500 having the second width W2 may be located on the first electrode 330.

The light emitting device 500 may include a first conductive semiconductor layer 510, a second conductive semiconductor layer 530, and an active layer 520 positioned between the first conductive semiconductor layer 510 and the second conductive semiconductor layer 530, a first contact electrode 540 in contact with the first conductive semiconductor layer 510, and a second contact electrode 550 in contact with the second conductive semiconductor layer 530.

In this regard, a first conductivity may be an n-type, and a second conductivity may be a p-type. In addition, the second contact electrode 550 may be a transparent electrode.

As such, the light emitting device 500 may have a vertical structure. However, the present disclosure is not limited thereto. That is, in one example, the light emitting device 500 may have a horizontal or flip-chip structure.

Such light emitting device 500 may have a size of a micrometer unit. The light emitting device 500 having the size of the micrometer unit may be referred to as a micro LED (M-LED).

Figure 12:
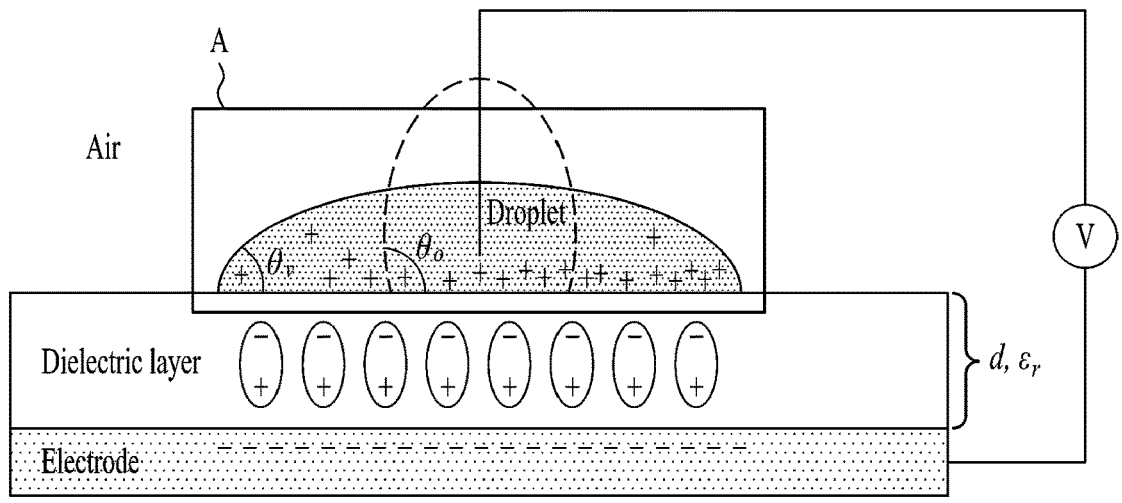
FIG. 12 is a schematic diagram showing a principle of an electro-wetting phenomenon that may be applied to an embodiment of the present disclosure.
Figure 13:
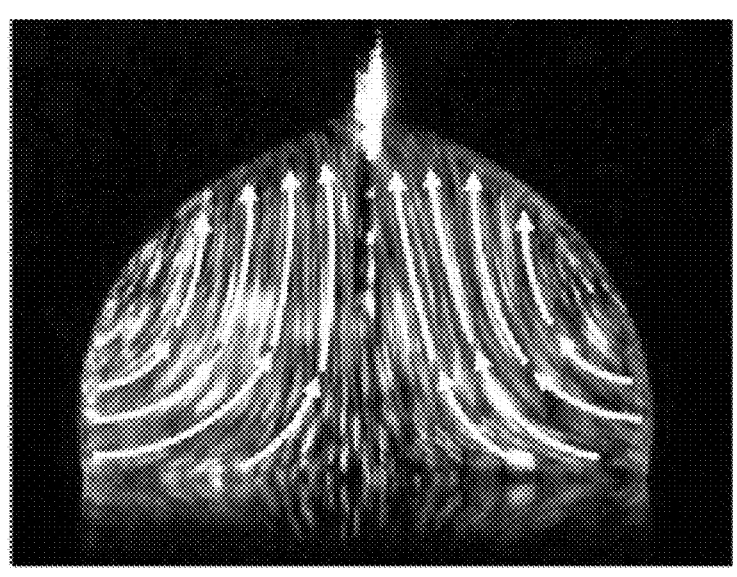
FIG. 13 is a schematic diagram showing an internal flow when an electro-wetting phenomenon occurs.

FIG. 12 is a schematic diagram showing a principle of an electro-wetting phenomenon that may be applied to an embodiment of the present disclosure, and FIG. 13 is a schematic diagram showing an internal flow when an electro-wetting phenomenon occurs.

As described above, the fluid 10 in which the multiple light emitting devices 500 are dispersed may be injected between the first substrate assembly 300 and the second substrate assembly 400. In addition, the fluid 10 in which the multiple light emitting devices 500 are dispersed may flow or migrate by the electro-wetting phenomenon.

In such electro-wetting phenomenon, when a low frequency (LF) alternating current (AC) voltage is applied between the first substrate assembly 300 and the second substrate assembly 400, charges are accumulated in the insulating layer 430 of the upper second substrate assembly 400, resulting in causes migration of water ions inside the fluid 10. Therefore, the multiple light emitting devices 500 inside the fluid 10 are circulated, and the light emitting devices 500 are migrated to the respective individual device areas of the first substrate assembly 300.

As such, the lower first substrate assembly 300 may act as the assembly substrate onto which the light emitting device 500 is assembled. In addition, a probability that the multiple light emitting devices 500 inside the fluid 10 described above are circulated by the electro-wetting phenomenon and migrated to the seating portions (i.e., the individual device areas) of the assembly substrate may increase.

Because the fluid 10 may migrate freely on a plane using such electro-wetting phenomenon, even a small amount of the fluid 10 is advantageous for assembly of a large-area display substrate.

In general, a frequency for generating the electro-wetting phenomenon may correspond to a frequency range from approximately direct current (DC; i.e., a frequency of 0) to 10 KHz.

Figure 14:
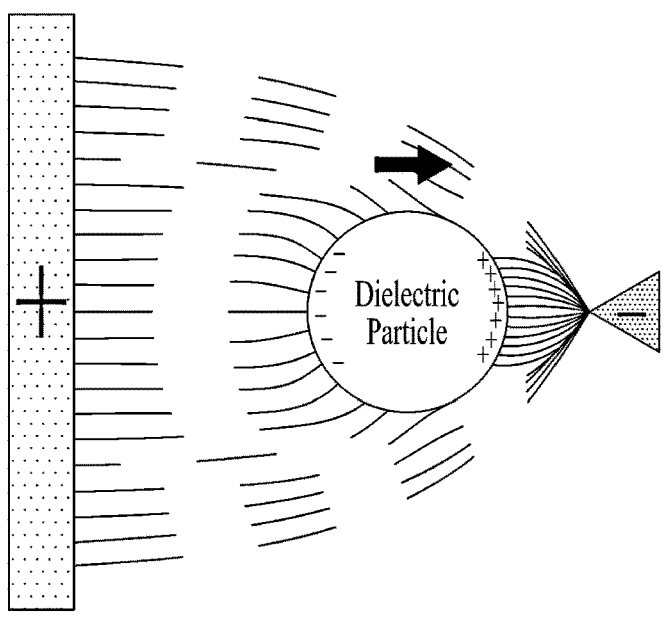
FIG. 14 is a schematic diagram showing a principle of a dielectrophoresis phenomenon that may be applied to an embodiment of the present disclosure.
Figure 14:
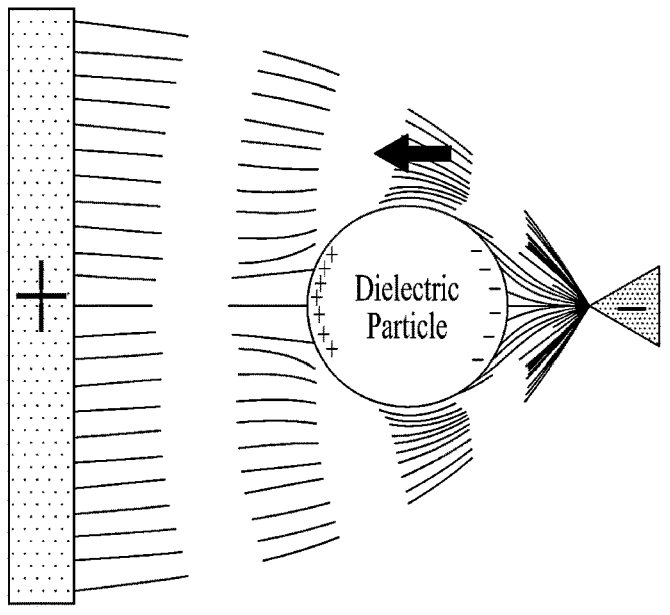

FIG. 14 is a schematic diagram showing a principle of a dielectrophoresis phenomenon that may be applied to an embodiment of the present disclosure.

The fluid 10 in which the multiple light emitting devices 500 are dispersed is injected between the first substrate assembly 300 and the second substrate assembly 400, so that the probability that the multiple light emitting devices 500 flowed or migrated by the electro-wetting phenomenon migrate to the seating portions (i.e., the individual device areas) may be greatly increased.

In this regard, when a high frequency (HF) alternating current (AC) voltage is applied between the first substrate assembly 300 and the second substrate assembly 400, the light emitting device 500 may be polarized by an electric field generated between the first substrate assembly 300 and the second substrate assembly 400.

That is, the light emitting devices 500 may migrate to a place where the electric field is dense or to a place where the electric field is not dense (sparse) via positive ((a) in FIG. 14) or negative ((b) in FIG. 14) polarization by the electric field generated between the first substrate assembly 300 and the second substrate assembly 400.

For example, the light emitting device 500 may be assembled by migrating to the assembly portion, that is, onto the first electrode 330 of the first substrate assembly 300 via the positive polarization as shown in (a) in FIG. 14.

That is, the light emitting device 500 flowed or migrated by the electro-wetting phenomenon and positioned near the first electrode 330 may be assembled onto the first electrode 330 of the first substrate assembly 300 via the positive polarization.

In general, the frequency for generating the electro-wetting phenomenon may correspond to a frequency range from approximately several tens of kHz to several hundred MHz.

As such, according to the embodiment of the present disclosure, the flow of the fluid 10 may be induced using the electro-wetting phenomenon to increase the probability that the light emitting device 500 is positioned on the seating portion of the assembly substrate. In addition, the light emitting device 500 migrated to the location near the seating portion of the assembly substrate may be pulled to the electrode (the first electrode 330) of the assembly substrate and self-assembled using the dielectrophoresis phenomenon.

Figure 15:
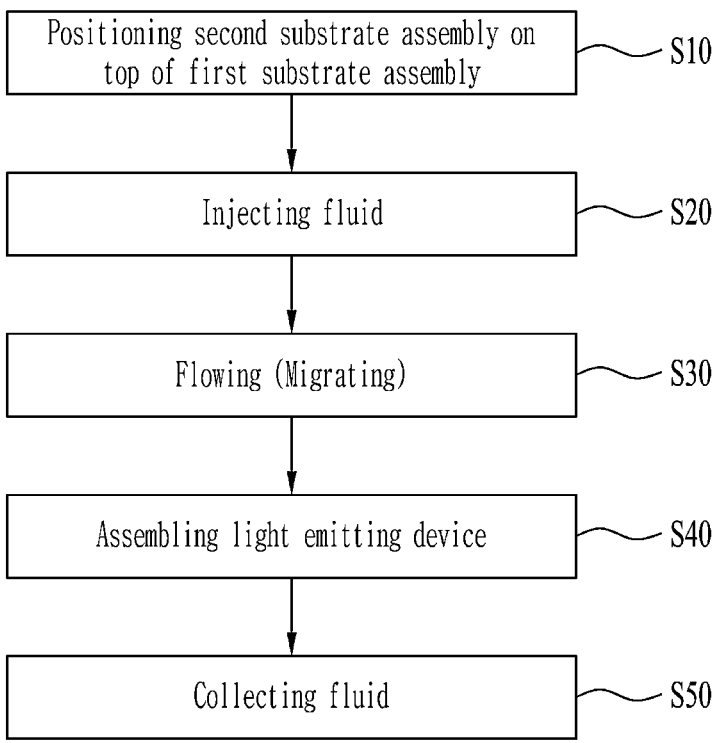
FIG. 15 is a flowchart illustrating a method for manufacturing a display device using a semiconductor light emitting element according to an embodiment of the present disclosure.

FIG. 15 is a flowchart illustrating a method for manufacturing a display device using a semiconductor light emitting element according to an embodiment of the present disclosure.

Referring to FIG. 15, the manufacturing method according to the embodiment of the present disclosure may include positioning the second substrate assembly 400 including the second substrate 410 on the second electrode 420 located on the first substrate assembly 300 (S10), injecting the fluid 10 in which the multiple light emitting devices 500 are dispersed between the first substrate assembly 300 and the second substrate assembly 400 (S20), allowing the multiple light emitting devices to flow (migrate) (S30), and assembling at least one of the multiple light emitting devices 500 onto the first electrode 330 located within the individual device area (S40). In addition, the manufacturing method according to the embodiment of the present disclosure may further include collecting the fluid 10 containing the light emitting devices 500 remaining after the assembly (S50).

FIGS. 16 to 19 are schematic cross-sectional views illustrating a method for manufacturing a display device using a semiconductor light emitting element according to an embodiment of the present disclosure.

Hereinafter, the method for manufacturing the display device using the semiconductor light emitting element according to the embodiment of the present disclosure will be described step by step with reference to FIGS. 16 to 19. In this regard, the description may be made with reference to a corresponding step shown in FIG. 15 together.

Figure 16:
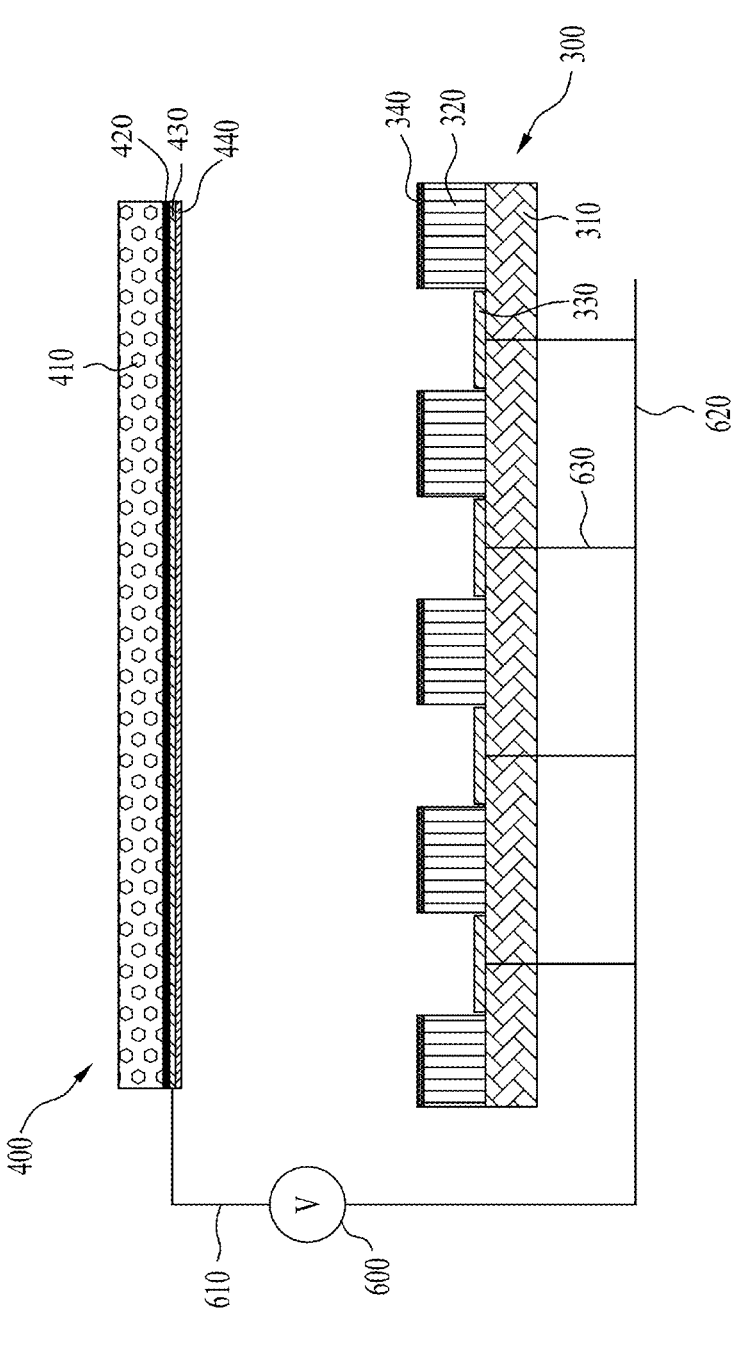
FIGS. 16 to 19 are schematic cross-sectional views illustrating a method for manufacturing a display device using a semiconductor light emitting element according to an embodiment of the present disclosure.

Referring to FIG. 16, arrangement of the substrate assemblies 300 and 400 for implementing the method for manufacturing the display device using the semiconductor light emitting element according to the embodiment of the present disclosure is shown.

The manufacturing method according to the embodiment of the present disclosure may be executed by the first substrate assembly 300 and the second substrate assembly 400 located on and spaced, by the predetermined distance, apart from the first substrate assembly 300 (S10).

In the first substrate assembly 300, the multiple individual device areas in which the first electrodes 330 are respectively located on the first substrate 310 may be defined to be divided from each other by the partition wall 320. The multiple individual device areas defined by the partition wall 320 may define the spaces in which the respective light emitting devices 500 are mounted.

The first electrodes 330 may be located in the multiple individual device areas, respectively. Such individual device areas may form the sub-pixels of the display device. Accordingly, the individual device area may be referred to as the individual sub-pixel area or the individual unit pixel area. Such area may be the same as that described above.

The first electrode 330 may be located in each of such individual device areas.

The first substrate 310 may include the active matrix (AM) display structure. For example, the first substrate 310 may include the thin film transistor (TFT) or the CMOS connected to the first electrode 330.

As another example, the first substrate 310 may include the passive matrix (PM) structure. For example, the first substrate 310 may include the structure for the passive matrix driving.

The first hydrophobic film 340 may be located on the partition wall 320. That is, the first hydrophobic film 340 may be coated and formed on the partition wall 320.

The second substrate assembly 400 may include the second substrate 410 having the second electrode 420 formed on and spaced apart from the first substrate assembly 300. In this regard, the insulating layer 430 may be located on the second electrode 420. For example, the second electrode 420 may be covered with the insulating layer 430.

The second hydrophobic film 440 may be located on the insulating layer 430. That is, the second hydrophobic film 440 may be coated and formed on the insulating layer 430.

The second substrate 410 may include the transparent substrate. In addition, the second electrode 420 may include the transparent electrode.

Each of the first electrode 330 and the second electrode 420 may be connected to the power supply 600. The second electrode 420 may be connected to the power supply 600 via the first power line 610. The first electrode 330 may be connected to the power supply 600 by the second power line 620 connected to the power supply 600, and the second branch line 630 branched from the second power line 620 and connected to each first electrode 330.

The first substrate assembly 300 may be used as the assembly substrate onto which the light emitting device 500 is assembled. In this regard, the first electrode 330 of the first substrate assembly 300 may be used as an assembly electrode for assembling the light emitting device 500. In addition, at the same time, the first electrode 330 of the first substrate assembly 300 may be used as a driving electrode of the display device after the assembly is made.

As such, the first electrode 330 of the first substrate assembly 300 may be used as the assembly electrode and the driving electrode.

Additionally, the second substrate assembly 400 may be used temporarily. For example, the second electrode 420 of the second substrate assembly 400 may be used together with the first electrode 330 of the first substrate assembly 300 to be used as the assembly electrode for assembling the light emitting device 500.

Thereafter, the second substrate assembly 400 may be removed after the assembly of the light emitting device 500 is completed. Next, after an additional process such as formation of an upper electrode is performed on the first substrate assembly 300 to manufacture the display device, the first electrode 330 may be used as the driving electrode of the display device after the assembly.

Other components not described may be the same as those in the description related to FIG. 10.

Figure 17:
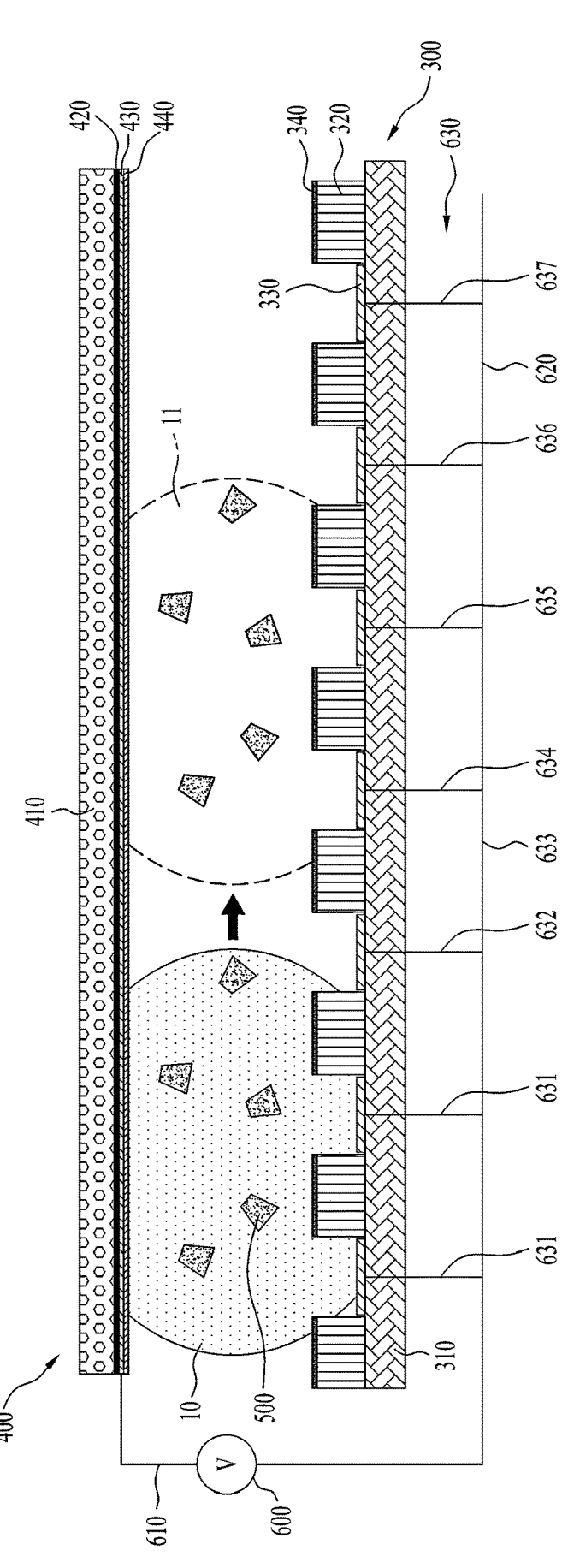

Referring to FIG. 17, a process of assembling the light emitting device 500 using the arrangement of the substrate assemblies 300 and 400 to implement the method for manufacturing the display device using the semiconductor light emitting element according to the embodiment of the present disclosure as shown in FIG. 16 is shown.

The fluid 10 in which the multiple light emitting devices 500 are dispersed may be injected between the first substrate assembly 300 and the second substrate assembly 400 (S20). Such fluid 10 may be the conductive or polar liquid. As an example, the fluid 10 may be the electrolyte liquid.

As such, the fluid 10 in which the multiple light emitting devices 500 are dispersed may flow or migrate by the electro-wetting phenomenon (S30). To this end, the first voltage signal having the first frequency range may be applied to at least one of the first electrode 330 and the second electrode 420, or to the first electrode 330 or the second electrode 420 while the first electrode 330 and the second electrode 420 are connected to the power supply 600. In this regard, such first frequency range may be the frequency range in which the electro-wetting phenomenon may occur. Such first frequency range may correspond to the frequency range from approximately the direct current (DC; i.e., the frequency of 0) to 10 KHz.

Referring to FIG. 17, the first electrode 330 may be connected to the power supply 600 by the second branch line 630 branched from the second power line 620, which is connected to the power supply 600, and connected to each first electrode 330. Such second branch line 630 may include multiple branch lines 631 to 637 respectively connected to the first electrodes 330. Although the seven branch lines 631 to 637 are shown in FIG. 17, the number of multiple branch lines may correspond to the total number of first electrodes 330). That is, the multiple branch lines may be respectively connected to the individual device areas.

In such state, the first voltage signal having the first frequency range (low frequency; LF) may be applied to the first electrode 330 via the second power line 620. The flow of the light emitting devices 500 contained in the fluid 10 may occur by the application of such a first voltage signal. Accordingly, the probability that the light emitting device 500 is seated in the individual device area on the first electrode 330 may be greatly improved.

As such, the fluid 10 in which the light emitting devices 500 are dispersed may be fixed in position around the first electrode 330 by the electro-wetting phenomenon. In FIG. 17, the fluid 10 may be fixed in the position while forming a predetermined curvature (contact angle) between two first electrodes 330 respectively connected to the two branch lines 631 and 632 and the second electrode 420 facing the two first electrodes 330. However, in some cases, the fluid 10 may be located between one first electrode 330 connected to one branch line 631 and the second electrode 420 facing the one first electrode 330. That is, the fluid 10 in which the light emitting devices 500 are dispersed may be locally injected so as to come into contact with the one first electrode 330.

Thereafter, the fluid 10 in which the light emitting devices 500 are dispersed may be migrated to another location 11 by sequentially applying the voltage signal to the branch lines 631 to 637. For example, while sequentially applying the voltage signal to the branch lines 631 to 637 sequentially from the branch line 631 on a left side to the branch line 637 on a right side of FIG. 17, the fluid 10 in which the light emitting devices 500 are dispersed may be migrated to the location between the corresponding first electrode 330 and the second electrode 420.

Figure 18:
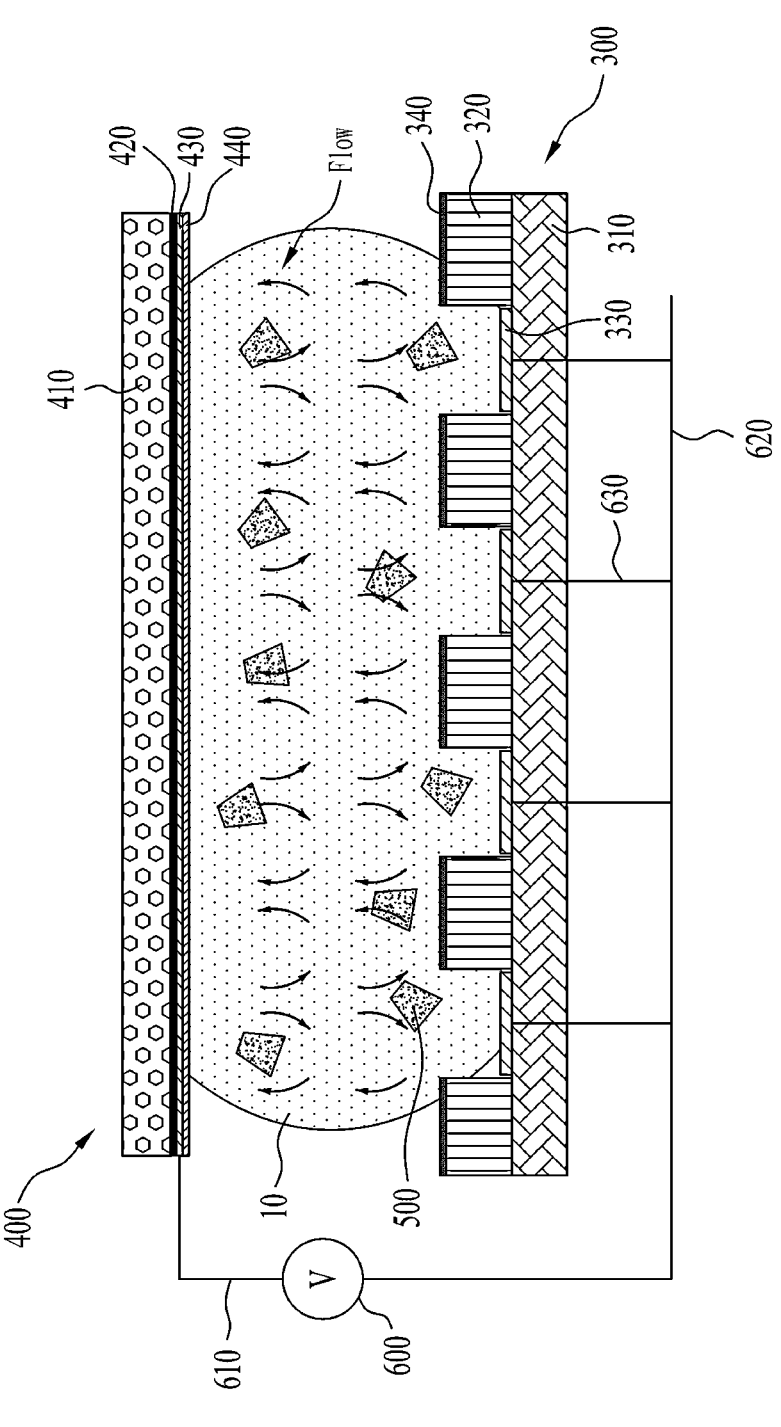

FIG. 18 schematically shows a situation in which the flow of the light emitting device 500 occurs within the fluid 10 when the first voltage signal having the first frequency range (LF) is applied to the corresponding first electrode 330.

As shown, when the flow of the light emitting device 500 occurs, the light emitting device 500 flows in a vertical or horizontal direction within the fluid 10. In this regard, there may be a light emitting device 500 migrating toward the corresponding first electrode 330 to which the voltage signal is applied.

Figure 19:
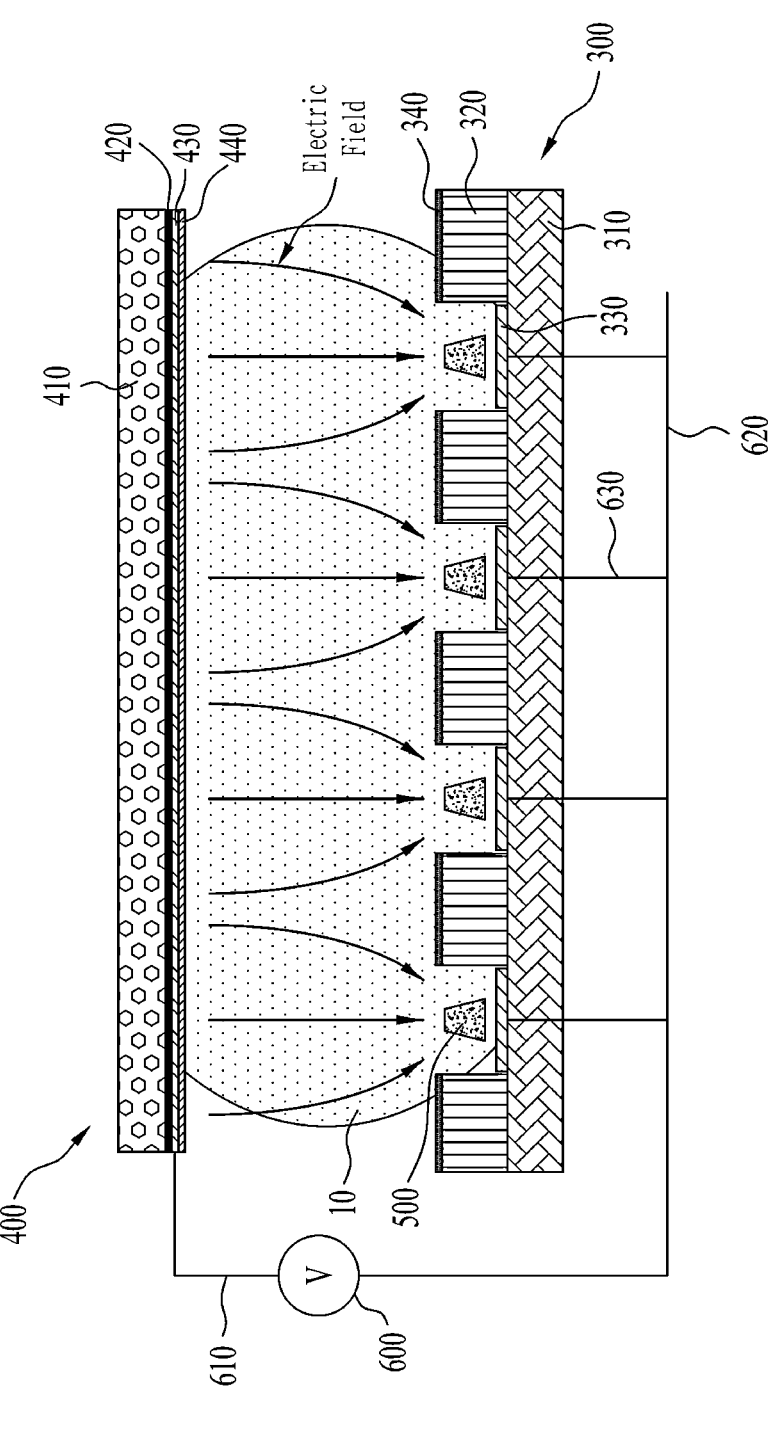

In this case, as shown in FIG. 19, when the second voltage signal having the second frequency range (the high frequency; HF) is applied to the corresponding first electrode 330, the light emitting device 500 migrating toward the corresponding first electrode 330 at this time point is attracted to the first electrode 330 by a DEP force caused by the dielectrophoresis (DEP) phenomenon. Therefore, the light emitting device 500 may be assembled to the corresponding first electrode (the assembly electrode) 330 (S40).

As described above, the assembly process of the light emitting device 500 may be performed while the fluid 10 migrates by sequentially passing the first electrodes (the assembly electrodes) 330.

As such, the lower first substrate assembly 300 may act as the assembly substrate onto which the light emitting device 500 is assembled. In addition, the probability that the multiple light emitting devices 500 within the fluid 10 described above are circulated by the electro-wetting phenomenon and migrated to the seating portions (i.e., the individual device areas) of the assembly substrate may increase.

Because the fluid 10 may migrate freely on the plane using such electro-wetting phenomenon, even a small amount of fluid 10 is advantageous for the assembly of the large-area display substrate.

As such, the light emitting devices 500 may be assembled in the respective individual device areas as the fluid 10 migrates sequentially passing the first electrodes.

Thereafter, the fluid 10 including the light emitting devices 500 remaining after the assembly may be collected outside the first substrate assembly 300 and the second substrate assembly 400 (S50).

Figure 20:
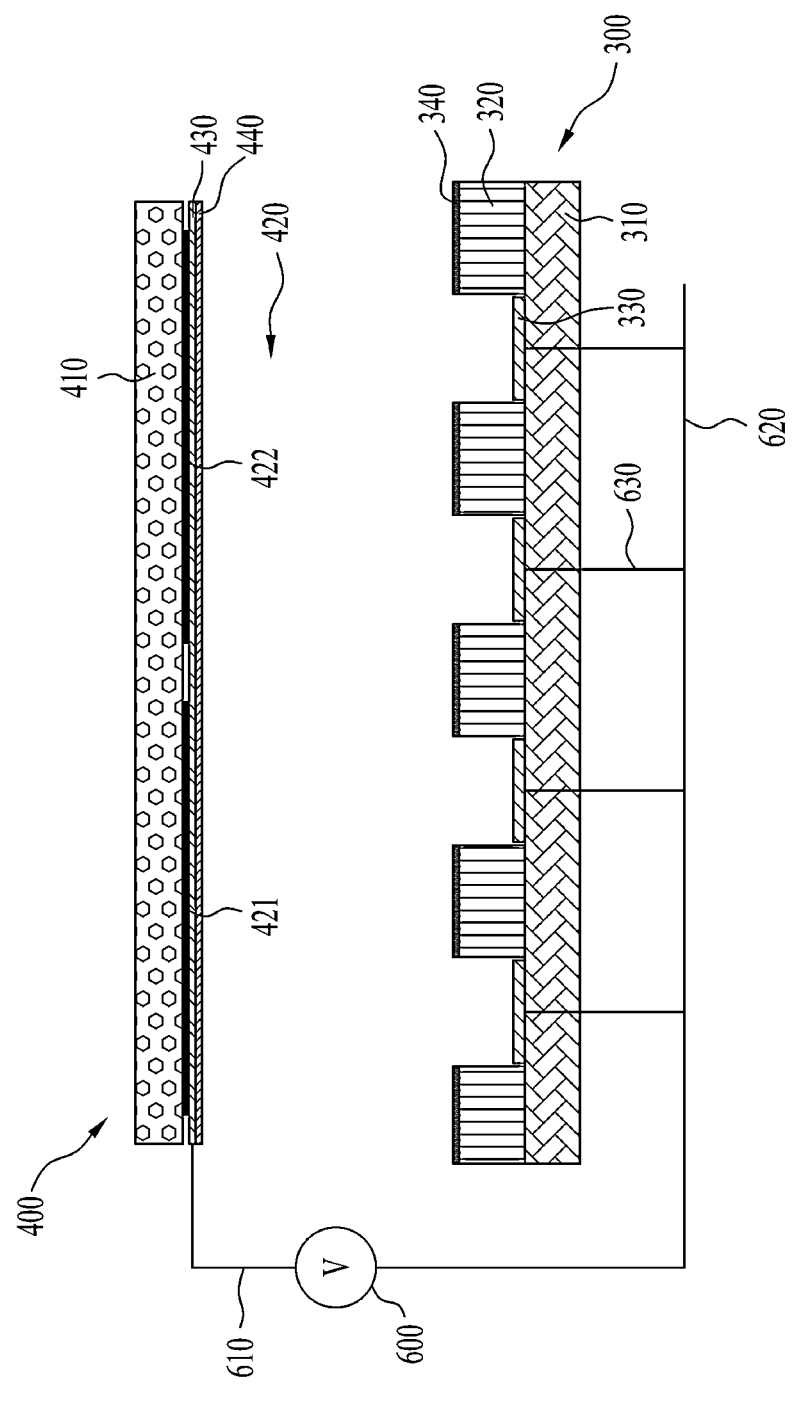
FIGS. 20 and 21 are schematic cross-sectional views illustrating a method for manufacturing a display device using a semiconductor light emitting element according to another embodiment of the present disclosure.
Figure 21:
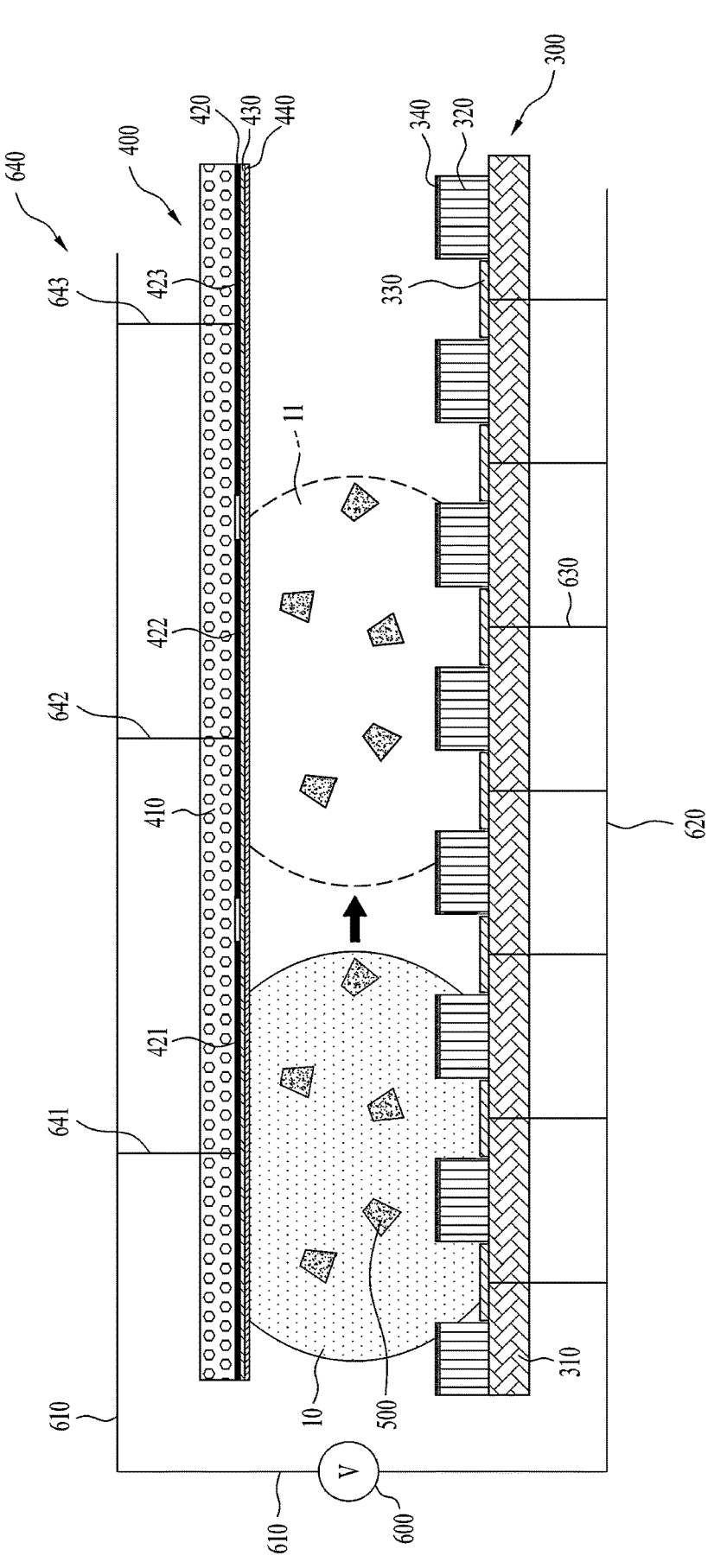

FIGS. 20 and 21 are schematic cross-sectional views illustrating a method for manufacturing a display device using a semiconductor light emitting element according to another embodiment of the present disclosure.

Referring to FIG. 20, arrangement of the substrate assemblies 300 and 400 for implementing the method for manufacturing the display device using the semiconductor light emitting element according to another embodiment of the present disclosure is shown.

The manufacturing method according to another embodiment of the present disclosure may be implemented by the first substrate assembly 300 and the second substrate assembly 400 formed on and spaced, by the predetermined distance, apart from the first substrate assembly 300.

In this regard, according to the manufacturing method according to the present embodiment, the first electrodes 330 on the first substrate assembly 300 may be commonly connected to the power supply 600, and the second electrode 420 on the second substrate assembly 400 may be pixelated into multiple electrodes.

For example, as shown in FIG. 20, the second electrode 420 may be divided into multiple electrodes 421 and 422. Accordingly, the first voltage signal having the first frequency range may be applied to the second electrode 420 to cause the electro-wetting phenomenon. In this regard, such first frequency range may be the frequency range in which the electro-wetting phenomenon may occur. Such first frequency range may correspond to the frequency range from approximately the direct current (DC; i.e., the frequency of 0) to 10 KHz.

Other matters may be the same as those described with reference to FIG. 16. Therefore, redundant descriptions are omitted.

Referring to FIG. 21, a process in which the light emitting device 500 is assembled using the arrangement of the substrate assemblies 300 and 400 for implementing the method for manufacturing the display device using the semiconductor light emitting element according to another embodiment of the present disclosure as shown in FIG. 20 is shown.

The fluid 10 in which the multiple light emitting devices 500 are dispersed may be injected between the first substrate assembly 300 and the second substrate assembly 400 (S20). Such fluid 10 may be the conductive or polar liquid. As an example, the fluid 10 may be the electrolyte liquid.

As such, the fluid 10 in which the multiple light emitting devices 500 are dispersed may flow or migrate by the electro-wetting phenomenon (S30). To this end, the first voltage signal having the first frequency range may be applied to at least one of the first electrode 330 and the second electrode 420, or to the first electrode 330 or the second electrode 420 while the first electrode 330 and the second electrode 420 are connected to the power supply 600. In this regard, such first frequency range may be the frequency range in which the electro-wetting phenomenon may occur. Such first frequency range may correspond to the frequency range from approximately the direct current (DC; i.e., the frequency of 0)) to 10 KHz.

Referring to FIG. 21, the second electrode 420 may be connected to the power supply 600 by a first branch line 640 branched from the first power line 610, which is connected to the power supply 600, and connected to each second electrode 420. Such first branch line 640 may include multiple branch lines 641 to 643 respectively connected to the second electrodes 420. Although the three branch lines 641 to 643 are shown in FIG. 21, the number of multiple branch lines may correspond to the total number of divided second electrodes 420. That is, the multiple branch lines may be respectively connected to the individual device areas.

In such state, the first voltage signal having the first frequency range (the low frequency; LF) may be applied to the second electrode 420 via the first power line 610. The flow of the light emitting devices 500 contained in the fluid 10 may occur by the application of such a first voltage signal. Accordingly, the probability that the light emitting device 500 is seated in the individual device area on the first electrode 330 may be greatly improved.

As such, the fluid 10 in which the light emitting devices 500 are dispersed may be fixed in the position around the first electrode 330 by the electro-wetting phenomenon. In FIG. 21, the fluid 10 may be fixed in the position while forming a predetermined curvature (contact angle) between two first electrodes 330 respectively connected to the two branch lines 631 and 632 and one second electrode 421 facing the two first electrodes 330. However, in some cases, the fluid 10 may be located between one first electrode 330 connected to one branch line 631 and the second electrode 421 facing the one first electrode 330. That is, the fluid 10 in which the light emitting devices 500 are dispersed may be locally injected so as to come into contact with the one first electrode 330.

Thereafter, the fluid 10 in which the light emitting devices 500 are dispersed may be migrated to another location 11 by sequentially applying the voltage signal to the first branch lines 641 to 642. For example, while sequentially applying the voltage signal to the first branch lines 641 to 642 from the first branch line 641 on a left side to the first branch line 642 on a right side in FIG. 21, the fluid 10 in which the light emitting devices 500 are dispersed may be migrated to the location between the corresponding first electrode 330 and the second electrode 421.

A following process may be the same as that in the embodiment described above. That is, the details may be the same as those described with reference to FIGS. 18 and 19, so that duplicate descriptions will be omitted below.

Figure 23:
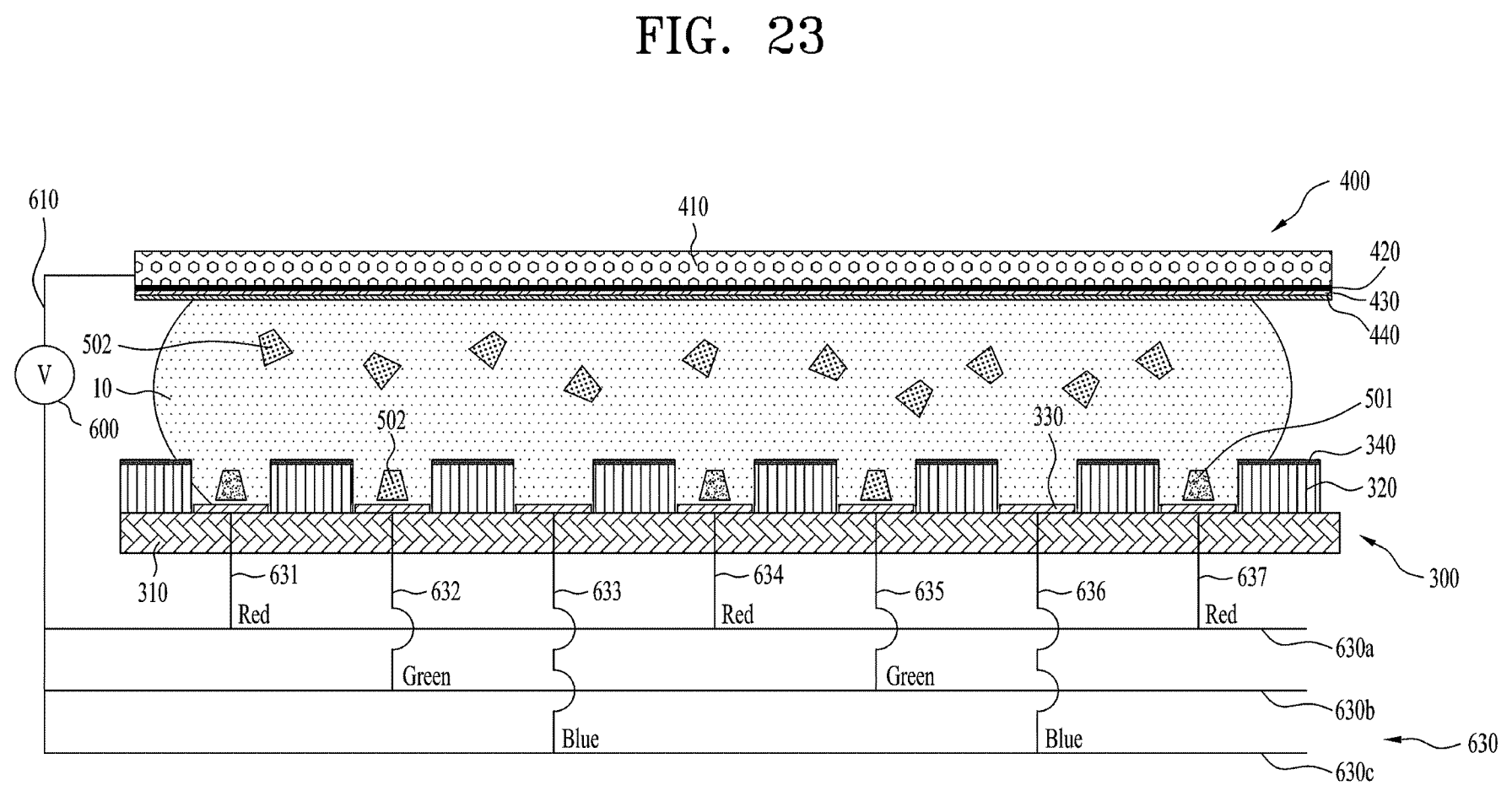
Figure 24:
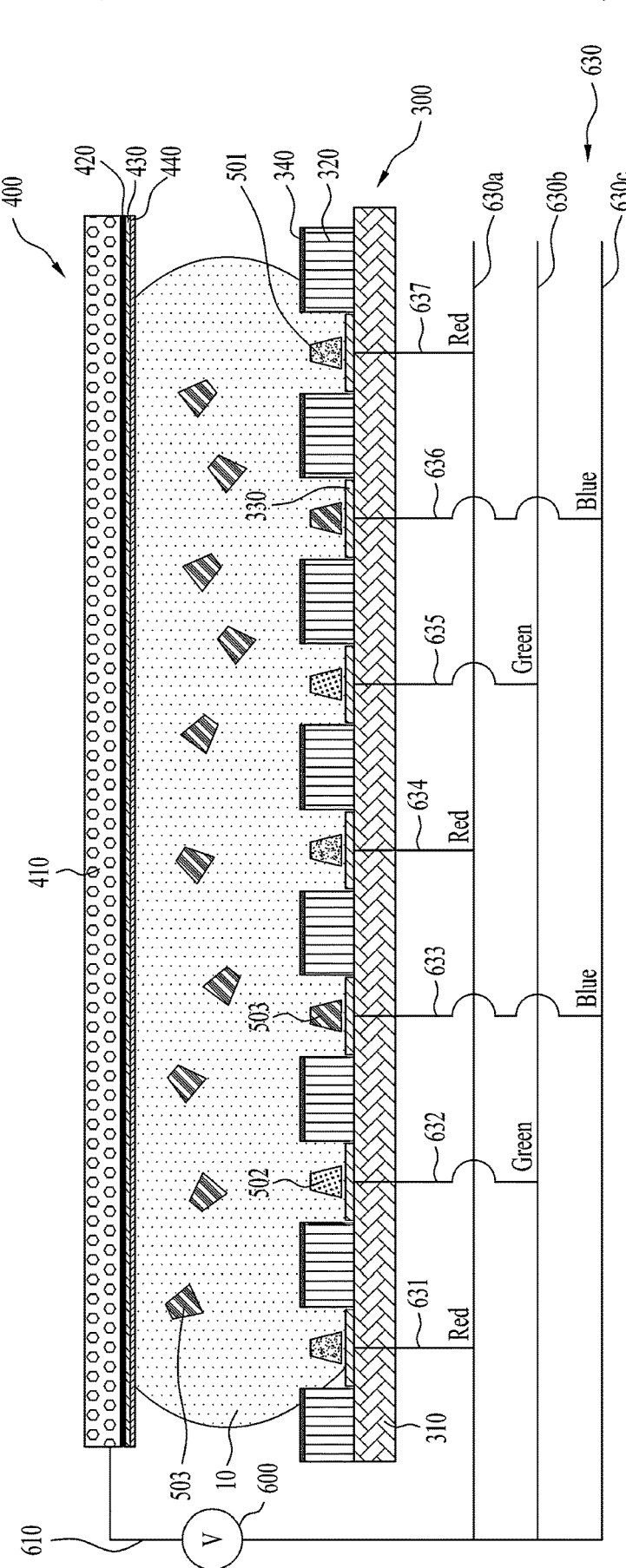
FIG. 24 is a schematic cross-sectional view illustrating a process of assembling a blue light emitting device in a method for manufacturing a display device using a semiconductor light emitting element according to an embodiment of the present disclosure.

In one example, the process of assembling the light emitting device 500 using the arrangement of the substrate assemblies 300 and 400 as described above may be sequentially performed for colors of the light emitting devices 500. For example, in the process of assembling the light emitting devices 500 of the respective colors, a red light emitting device 501, a green light emitting device 502, and a blue light emitting device 503 constituting one pixel may be sequentially assembled. The process of assembling the light emitting devices 500 of the respective colors will be described in detail with reference to drawings (FIGS. 22 to 24).

Figure 22:
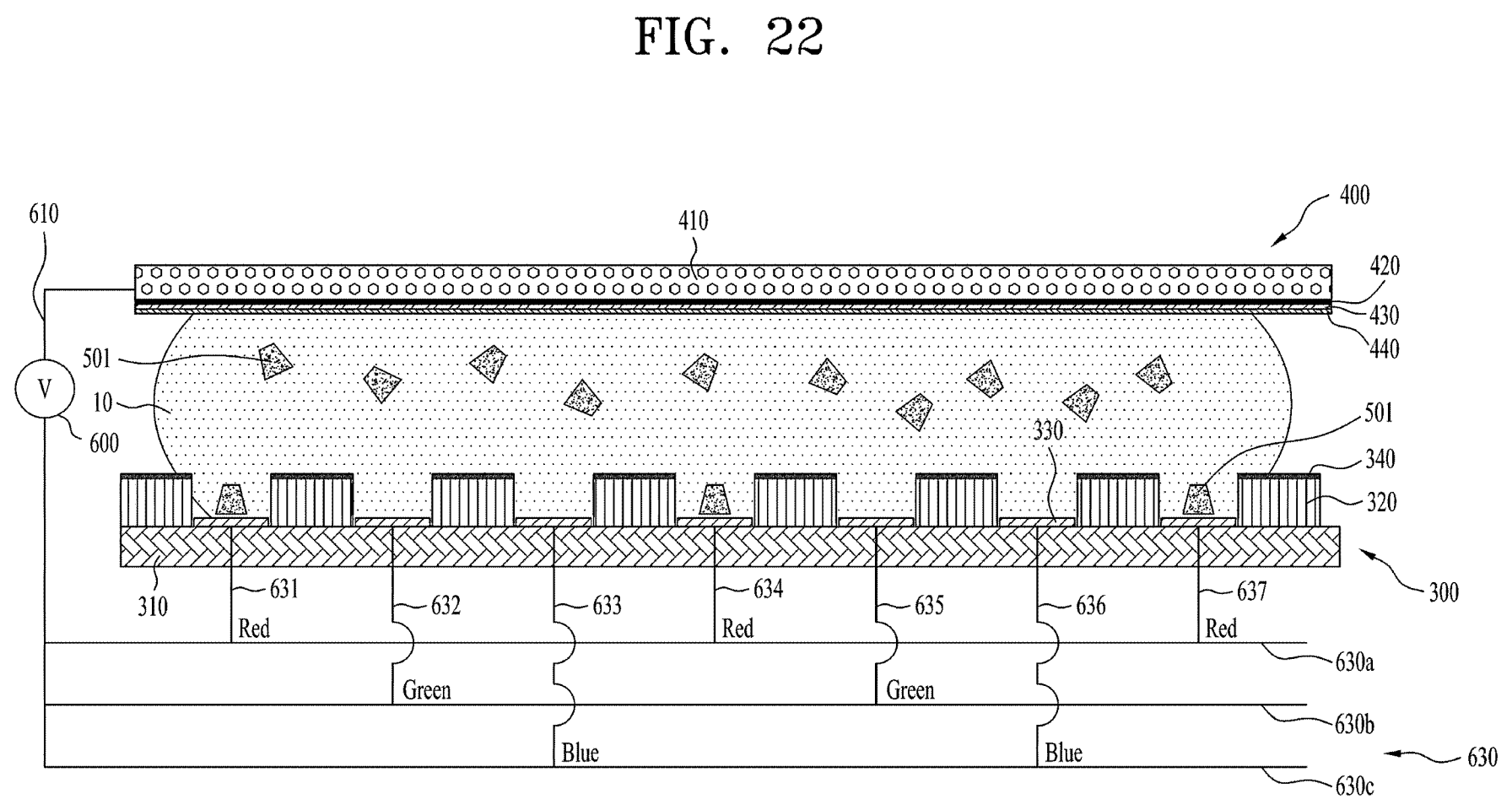

FIG. 22 is a schematic cross-sectional view illustrating a process of assembling a red light emitting device in a method for manufacturing a display device using a semiconductor light emitting element according to an embodiment of the present disclosure. FIG. 23 is a schematic cross-sectional view illustrating a process of assembling a green light emitting device in a method for manufacturing a display device using a semiconductor light emitting element according to an embodiment of the present disclosure. In addition, FIG. 24 is a schematic cross-sectional view illustrating a process of assembling a blue light emitting device in a method for manufacturing a display device using a semiconductor light emitting element according to an embodiment of the present disclosure.

Referring to FIG. 22, a pixel structure may be constructed by sequentially repeating red, green, and blue pixels on the first substrate assembly 300.

To this end, as in FIG. 17, the second branch line 630 with which the power supply 600 is connected to each first electrode 330 may include the multiple branch lines 631 to 637 respectively connected to the first electrodes 330. Such second branch line 630 may be divided into three including a red line 630a, a green line 630b, and a blue line 630c.

In this regard, because the red, green, and blue pixels are repeated in a sequential manner, the first and fourth branch lines 631 and 634 among the seven branch lines 631 to 637 may correspond to unit device areas connected to the red line 630a and where the red light emitting devices 501 are assembled.

In addition, among the seven branch lines 631 to 637, the second and fifth branch lines 632 and 635 may correspond to unit device areas connected to the green line 630b and where the green light emitting devices 502 are assembled.

In addition, among the seven branch lines 631 to 637, the third and sixth branch lines 633 and 636 may correspond to unit device areas connected to the blue line 630c and where the blue light emitting devices 503 are assembled.

In FIG. 22, only portions of such structures of pixels and branch lines are represented. However, such structures of pixels and branch lines may be repeated throughout entire pixels of the display. In addition, such structure may correspond to FIGS. 22 to 24 in common.

In such state, first, the fluid 10 in which the multiple red light emitting devices 501 are dispersed may be injected between the first substrate assembly 300 and the second substrate assembly 400.

Referring to FIG. 22, the fluid 10 in which the multiple red light emitting devices 501 are dispersed may be located over a predetermined range of the unit device areas. In FIG. 22, it may be seen that the fluid 10 is located over an entirety of the unit device areas connected to the seven branch lines 631 to 637.

In this regard, allowing the light emitting devices 501 to migrate or flow by applying the first voltage signal having the first frequency range (the low frequency; LF) described above may be performed simultaneously or sequentially for the seven branch lines 631 to 637. That is, the first voltage signal having the first frequency range (the low frequency; LF) may be simultaneously or sequentially applied to the seven branch lines 631 to 637.

Thereafter, the second voltage signal having the second frequency range (the high frequency; HF) may be applied to the unit device areas where the red light emitting devices 501 are assembled via the red line 630a and the first and fourth branch lines 631 and 634.

Then, the light emitting device 501 migrating toward the first electrode 330 corresponding to a location of the red pixel may be attracted to the corresponding first electrode 330 by the DEP force caused by the dielectrophoresis (DEP) phenomenon. Therefore, the red light emitting device 501 may be assembled to the corresponding first electrode (the assembly electrode) 330.

Thereafter, the fluid 10 in which unassembled red light emitting devices 501 are dispersed may be migrated and collected.

Next, referring to FIG. 23, a process of assembling the green light emitting device 502 will be described.

First, the fluid 10 in which the multiple green light emitting devices 502 are dispersed may be injected between the first substrate assembly 300 and the second substrate assembly 400.

Referring to FIG. 23, the fluid 10 in which the multiple green light emitting devices 502 are dispersed may be located over a predetermined range of the unit device areas.

In this regard, allowing the green light emitting devices 502 to migrate or flow by applying the first voltage signal having the first frequency range (the low frequency; LF) described above may be performed simultaneously or sequentially for the seven branch lines 631 to 637. That is, the first voltage signal having the first frequency range (the low frequency; LF) may be simultaneously or sequentially applied to the seven branch lines 631 to 637.

Thereafter, the second voltage signal having the second frequency range (the high frequency; HF) may be applied to the unit device areas where the green light emitting devices 502 are assembled via the green line 630b and the second and fifth branch lines 632 and 635.

Then, the green light emitting device 502 migrating toward the first electrode 330 corresponding to a location of the green pixel may be attracted to the corresponding first electrode 330 by the DEP force caused by the dielectrophoresis (DEP) phenomenon. Therefore, the green light emitting device 502 may be assembled to the corresponding first electrode (the assembly electrode) 330.

In this regard, in the process described above, the second voltage signal having the second frequency range (the high frequency; HF) applied via the red line 630a and the first and fourth branch lines 631 and 634 may be maintained. Accordingly, the assembled state of the already assembled red light emitting devices 501 may be maintained.

Thereafter, the fluid 10 in which unassembled green light emitting devices 502 are dispersed may be migrated and collected.

Next, referring to FIG. 24, a process of assembling the blue light emitting device 503 will be described.

First, the fluid 10 in which the multiple blue light emitting devices 503 are dispersed may be injected between the first substrate assembly 300 and the second substrate assembly 400.

Referring to FIG. 24, the fluid 10 in which the multiple blue light emitting devices 503 are dispersed may be located over a predetermined range of the unit device areas.

In this regard, allowing the light emitting devices 503 to migrate or flow by applying the first voltage signal having the first frequency range (the low frequency; LF) described above may be performed simultaneously or sequentially for the seven branch lines 631 to 637. That is, the first voltage signal having the first frequency range (the low frequency; LF) may be simultaneously or sequentially applied to the seven branch lines 631 to 637.

Thereafter, the second voltage signal having the second frequency range (the high frequency; HF) may be applied to the unit device areas where the blue light emitting devices 503 are assembled via the blue line 630c and the third and sixth branch lines 633 and 636.

Then, the blue light emitting device 503 migrating toward the first electrode 330 corresponding to a location of the green pixel may be attracted to the corresponding first electrode 330 by the DEP force caused by the dielectrophoresis (DEP) phenomenon. Therefore, the blue light emitting device 503 may be assembled to the corresponding first electrode (the assembly electrode) 330.

In this regard, in the process described above, the second voltage signal having the second frequency range (the high frequency; HF) applied via the red line 630a and the first and fourth branch lines 631 and 634 may be maintained. In addition, in the process described above, the second voltage signal having the second frequency range (the high frequency; HF) applied via the green line 630b and the second and fifth branch lines 632 and 635 may be maintained.

Accordingly, the assembled states of the already assembled red light emitting devices 501 and green light emitting devices 502 may be maintained.

Thereafter, the fluid 10 in which unassembled blue light emitting devices 503 are dispersed may be migrated and collected.

Figure 25:
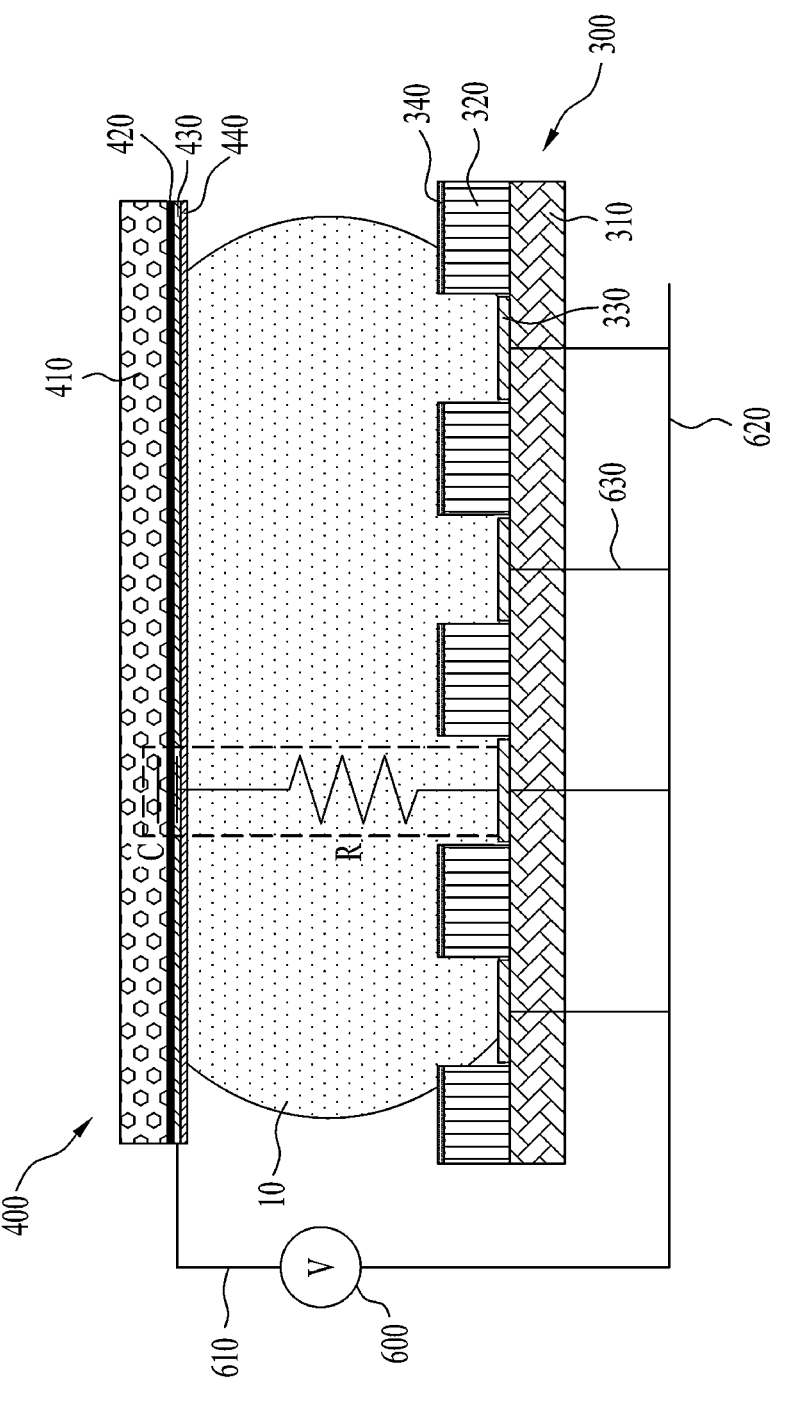
FIG. 25 is a schematic diagram for illustrating a frequency of a voltage signal of a method for manufacturing a display device using a semiconductor light emitting element according to an embodiment of the present disclosure.

FIG. 25 is a schematic diagram for illustrating a frequency of a voltage signal of a method for manufacturing a display device using a semiconductor light emitting element according to an embodiment of the present disclosure.

In the configuration of the substrate assembly for the manufacturing method described above, as an equivalent circuit model, the conductive fluid 10 may be simply modeled as a resistor R and the insulating layer 430 as a capacitor C.

In such circuit model, as the frequency increases, impedance of the capacitor C decreases, so that most of the voltage may be applied to the conductive fluid 10. Such state may be referred to as a dielectrophoresis mode.

On the other hand, in the circuit model, as the frequency decreases, the impedance of the capacitor C increases, so that most of the voltage may be applied to the insulating layer 430. Such state may be referred to as an electro-wetting mode.

As such, the dielectrophoresis mode and the electro-wetting mode may be adjustable based on the frequency of the voltage signal applied to the first electrode 330 or the second electrode 420.

In the state described above, the first voltage signal of the first frequency may be a frequency or a voltage for the electro-wetting mode, and the second voltage signal of the second frequency may be a frequency or a voltage for the dielectrophoresis mode.

In addition, a conductivity (a resistance; R) of the conductive fluid 10 and/or a capacitance C of the insulating layer 430 may affect such dielectrophoresis mode and electro-wetting mode. That is, the dielectrophoresis mode and the electro-wetting mode may be adjustable based on the applied frequency, the conductivity (the resistance; R) of the conductive fluid 10 and/or the capacitance C of the insulating layer 430.

Mathematical Formula 1 below is a formula representing impedance Zc when the resistor R and the capacitor C are connected to each other in series. In Mathematical Formula 1, ω represents the frequency.

In Mathematical Formula 1, as the frequency increases, the impedance Zc of the insulator converges to 0, so that most of the voltage is applied to the resistor R. This represents the state of the dielectrophoresis mode.

$$Zc = Rc - j/\omega C \qquad \text{[Mathematical Formula 1]}$$

Figure 26:
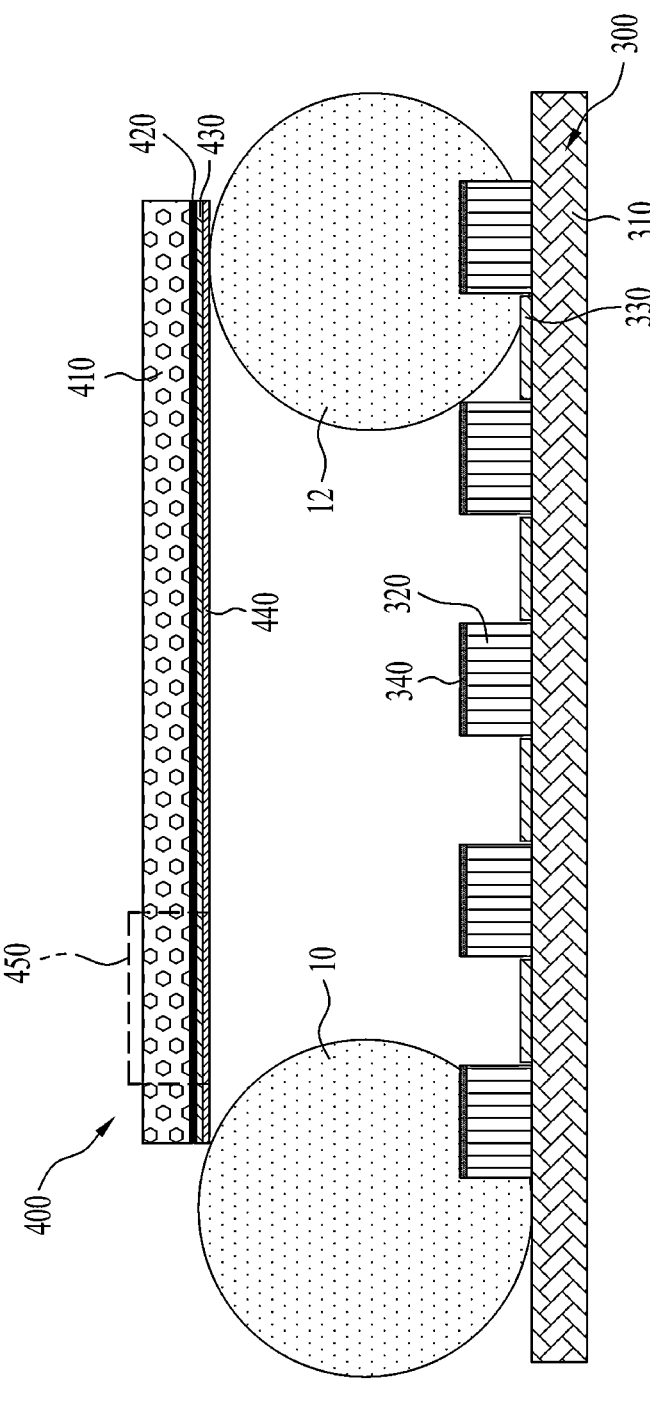
FIG. 26 is a schematic diagram illustrating fluid injection and collection processes of a method for manufacturing a display device using a semiconductor light emitting element according to an embodiment of the present disclosure.

FIG. 26 is a schematic diagram illustrating fluid injection and collection processes of a method for manufacturing a display device using a semiconductor light emitting element according to an embodiment of the present disclosure.

Referring to FIG. 26, the fluid 10 may be injected to one end of the space between the first substrate assembly 300 and the second substrate assembly 400.

As an example, an injection hole 450 may be defined at one end of the second substrate assembly 400. Such injection hole 450 may be defined through an entirety of the second substrate assembly 400. Accordingly, the fluid 10 may be injected via such injection hole 450.

On the other hand, after the assembly of the light emitting devices 500 is completed, the fluid 12 may be positioned at an opposite end of the space between the first substrate assembly 300 and the second substrate assembly 400. At such opposite end, the fluid 12 may be collected. The collection of the fluid 12 that has been assembled may be performed using a tool such as a dropper or other devices for absorbing the fluid.

Figure 27:
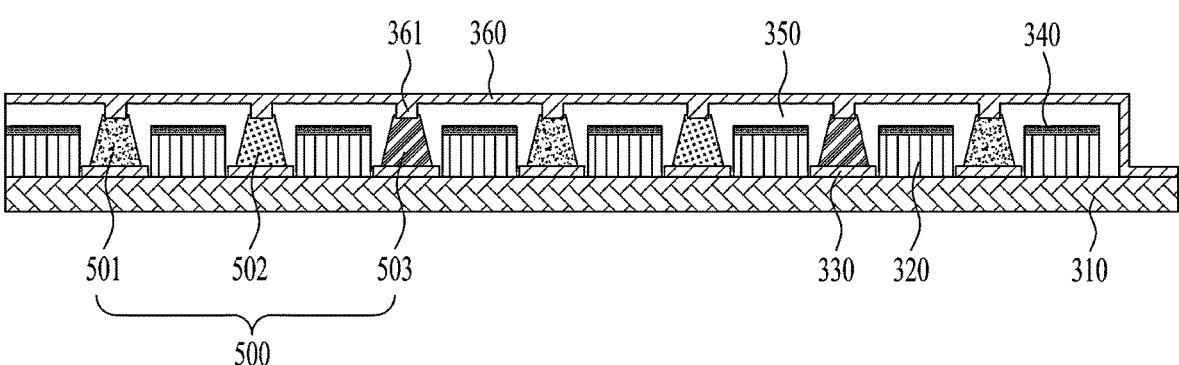
FIG. 27 is a cross-sectional view illustrating a display device using a semiconductor light emitting element according to an embodiment of the present disclosure.

FIG. 27 is a cross-sectional view illustrating a display device using a semiconductor light emitting element according to an embodiment of the present disclosure.

FIG. 27 shows the display device manufactured by the manufacturing method in the embodiment of the present disclosure.

Referring to FIG. 27, the light emitting device 500 including the red light emitting devices 501, the green light emitting devices 502, and the blue light emitting devices 503 respectively in the individual device areas defined on the first substrate assembly 300, the red, green, and blue light emitting devices may be sequentially assembled in the repeated manner.

A third electrode 360 may be electrically connected onto the light emitting devices 500 assembled as described above via contact portions 361. When the first substrate 310 of the first substrate assembly 300 is the substrate for the active matrix driving such as the TFT or CMOS substrate, the third electrode 360 may be a common electrode. That is, the third electrode 360 may be connected to the entire light emitting devices 500 at a common potential.

In this regard, an insulating structure layer 350 may be positioned on the partition wall 320 and/or the light emitting device 500. In addition, the third electrode 360 may be formed on such insulating structure layer 350.

When the display device structure is made in this way, the first electrode 330 may be used as the driving electrode of the display device.

In some cases, the first hydrophobic film 340 may be removed.

The method for manufacturing the display device using the semiconductor light emitting element according to the embodiment of the present disclosure as described above may be applied to a self-assembly method used for a high-resolution large-area display.

Such manufacturing method according to the embodiment of the present disclosure may solve the problems of the existing micro LED manufacturing methods, for example, reliability, precision, and complexity.

In addition, the manufacturing method according to the embodiment of the present disclosure may be applied to all of the red, green, and blue light emitting devices, so that a high-luminance full-color display may be implemented.

In addition, according to the manufacturing method according to the embodiment of the present disclosure, in the case of the vertical light emitting device, the assembly electrode may be used as the driving electrode as it is, reducing the process difficulty and realizing the high-resolution display.

In addition, according to the manufacturing method according to the embodiment of the present disclosure, the own flow or migration of the fluid in which the light emitting devices are dispersed may be generated, so that an assembly yield may be improved even when using a small number of light emitting devices are used.

In addition, the manufacturing method according to the embodiment of the present disclosure is advantageous in assembling the large-area display device because the light emitting devices dispersed in the fluid may be freely migrated to any location by the application of the voltage.

In addition, according to the manufacturing method according to the embodiment of the present disclosure, because the light emitting devices may be assembled while at the same time migrating the fluid using the multiple fluid droplets, so that an assembly time may be further reduced.

In addition, according to the manufacturing method according to the embodiment of the present disclosure, when the assembly of the light emitting devices is defective or the light emitting devices are not assembled, re-assembly is possible by migrating the fluid to an electrode where such problem has occurred. Therefore, a cost increase resulted from the assembly defect may be solved.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

INDUSTRIAL APPLICABILITY

According to the present disclosure, the substrate assembly of the display device using the semiconductor light emitting element such as the micro LED and the method for manufacturing the same may be provided.

What is claimed is:

1. A method for assembling multiple individual light emitting devices onto multiple individual device areas of a first substrate assembly where the multiple individual device areas are divided from each other on a first substrate and a first electrode is located in an individual device area among the multiple individual device areas, the method comprising:
   positioning a second substrate assembly including an insulating layer disposed on the first substrate assembly, a second electrode disposed on the insulating layer, and a second substrate disposed on the second electrode;
   injecting a fluid where the multiple individual light emitting devices are dispersed between the first substrate assembly and the second substrate assembly;
   allowing the multiple individual light emitting devices to flow within the fluid by an electro-wetting phenomenon; and
   assembling at least one of the multiple individual light emitting devices onto the first electrode disposed within the individual device area.

2. The method of claim 1, wherein the allowing of the multiple individual light emitting devices to flow includes applying a voltage signal in a first frequency range.

3. The method of claim 2, wherein the first frequency range corresponds to a frequency generating the electro-wetting phenomenon.

4. The method of claim 1, wherein the assembling of at least one of the multiple individual light emitting devices includes applying a voltage signal in a second frequency range greater than a first frequency range.

5. The method of claim 4, wherein the second frequency range corresponds to a frequency generating a dielectrophoresis phenomenon.

6. The method of claim 1, further comprising allowing the fluid where the multiple individual light emitting devices are dispersed to migrate to a neighboring individual device area among the multiple individual device areas.

7. The method of claim 1, further comprising, after the assembling of at least one of the multiple individual light emitting devices, collecting the fluid where the multiple individual light emitting devices are dispersed.

8. The method of claim 1, wherein the fluid is a conductive liquid.

9. The method of claim 1, wherein the fluid where the multiple individual light emitting devices are dispersed is locally injected to be in contact with the first electrode.

10. The method of claim 1, wherein the first electrode serves as an assembly electrode configured to assemble the at least one of the multiple individual light emitting devices and as a driving electrode configured to drive the assembled the at least one of the multiple individual light emitting devices.

11. A method for assembling multiple individual light emitting devices onto multiple individual device areas of a first substrate assembly including a partition wall defining the multiple individual device areas on a first substrate, a first hydrophobic film disposed on the partition wall, and a first electrode located on an individual device area among the multiple individual device areas, the method comprising:
   positioning, on the first hydrophobic film, a second substrate assembly including a second hydrophobic film disposed on and spaced, by a predetermined spacing, apart from the first hydrophobic film, a second electrode disposed on an insulating layer, and a second substrate disposed on the second electrode;
   injecting a fluid where the multiple individual light emitting devices are dispersed between the first substrate assembly and the second substrate assembly;
   allowing the multiple individual light emitting devices to flow by applying a voltage signal in a first frequency range to the first electrode; and
   assembling at least one of the multiple individual light emitting devices onto the first electrode by applying a voltage signal in a second frequency range greater than the first frequency range to the first electrode.

12. The method of claim 11, further comprising allowing the fluid where the multiple individual light emitting devices are dispersed to migrate to a neighboring individual device area among the multiple individual device areas.

13. The method of claim 11, further comprising, after the assembling of at least one of the multiple individual light emitting devices, collecting the fluid where the multiple individual light emitting devices are dispersed.

14. The method of claim 11, wherein the fluid is a conductive liquid.

15. The method of claim 11, wherein the fluid where the multiple individual light emitting devices are dispersed is locally injected to be in contact with the first electrode.

16. The method of claim 11, wherein the first electrode serves as an assembly electrode configured to assemble the at least one of the multiple individual light emitting devices and as a driving electrode configured to drive the assembled the at least one of the multiple individual light emitting devices.

17. The method of claim 11, further comprising allowing the fluid to migrate to a second area adjacent to a first area while maintaining an application of the voltage signal in the second frequency range to the first area where the at least one of the multiple individual light emitting devices is assembled.

18. A method for assembling multiple individual light emitting devices onto multiple individual device areas of a first substrate assembly where the multiple individual device areas are divided from each other on a first substrate and a first electrode is located in an individual device area among the multiple individual device areas, the method comprising:

positioning a second substrate assembly including a second substrate where a second electrode disposed on and spaced apart from the first substrate assembly is disposed;

injecting a fluid where the multiple individual light emitting devices are dispersed between the first substrate assembly and the second substrate assembly;

allowing the multiple individual light emitting devices to flow within the fluid by an electro-wetting phenomenon by applying a first voltage signal to the first electrode or the second electrode; and assembling at least one of the multiple individual light emitting devices onto the first electrode disposed within the individual device area by applying a second voltage signal to the first electrode or the second electrode.

19. A substrate assembly of a display device using a light emitting device, the substrate assembly comprising:

a first substrate assembly including multiple individual device areas; and a second substrate assembly disposed on and spaced, by a predetermined spacing, apart from the first substrate assembly, wherein the substrate assembly is configured to allow multiple individual light emitting devices to flow or migrate and to assemble the multiple individual light emitting devices onto the multiple individual device areas, wherein the first substrate assembly includes:

a first substrate;

a partition wall disposed on the first substrate to define the multiple individual device areas;

a first hydrophobic film disposed on the partition wall; and a first electrode disposed on an individual device area among the multiple individual device areas, and wherein the second substrate assembly includes:

a second hydrophobic film disposed on the first hydrophobic film;

an insulating layer disposed on the second hydrophobic film;

a second electrode disposed on the insulating layer; and a second substrate disposed on the second electrode.

20. The substrate assembly of claim 19, wherein the second substrate assembly is temporarily disposed on the first substrate assembly.

* * * * *